United States Patent [19]

Zhao et al.

[11] Patent Number: 5,558,717
[45] Date of Patent: Sep. 24, 1996

[54] CVD PROCESSING CHAMBER

[75] Inventors: Jun Zhao, Milpitas; Tom Cho, San Francisco; Charles Dornfest, Fremont; Stefan Wolff, Sunnyvale; Kevin Fairbairn, Saratoga; Xin S Guo, Mountain View; Alex Schreiber, Santa Clara; John M. White, Hayward, all of Calif.

[73] Assignee: Applied Materials, Santa Clara, Calif.

[21] Appl. No.: 348,273

[22] Filed: Nov. 30, 1994

[51] Int. Cl.$^6$ .................................. C23C 16/00
[52] U.S. Cl. .............. 118/715; 118/719; 118/723 E; 118/725; 118/728; 118/729; 118/723 ER
[58] Field of Search ............... 118/715, 719, 118/723 I, 723 IR, 723 E, 723 ER, 724, 725, 728, 729, 723 R

[56] References Cited

U.S. PATENT DOCUMENTS

| | | | |
|---|---|---|---|
| 4,457,359 | 7/1984 | Holden | 165/80 |
| 4,817,558 | 4/1989 | Itoh | 118/715 |
| 4,873,070 | 10/1989 | Kaji | 423/345 |
| 4,990,374 | 2/1991 | Keeley | 427/255.1 |
| 5,044,311 | 9/1991 | Mase | 118/723 |
| 5,192,370 | 3/1993 | Oda | 118/723 |
| 5,231,690 | 7/1993 | Soma | 392/416 |
| 5,271,963 | 12/1993 | Eichman | 427/248.1 |
| 5,294,778 | 3/1994 | Carman | 219/385 |
| 5,314,538 | 5/1994 | Maeda | 118/715 |
| 5,344,492 | 9/1994 | Sato | 118/725 |
| 5,366,585 | 11/1994 | Robertson | 156/643 |
| 5,372,648 | 12/1994 | Yamamoto | 118/723 E |
| 5,399,387 | 3/1995 | Law | 427/574 |
| 5,425,812 | 6/1995 | Tsutahara | 118/725 |
| 5,441,568 | 8/1995 | Cho | 118/715 |
| 5,445,677 | 8/1995 | Kawata | 118/724 |
| 5,449,410 | 9/1995 | Chang | 118/723 ER |
| 5,490,228 | 2/1996 | Soma | 392/416 |

FOREIGN PATENT DOCUMENTS

| | | | |
|---|---|---|---|
| 1359505 | 5/1963 | France | 118/725 |
| 196033 | 8/1988 | Japan | 118/725 |
| 180982 | 7/1989 | Japan | 118/723 E |
| 27715 | 1/1990 | Japan | 118/724 |
| 291927 | 12/1991 | Japan | 118/724 |
| 157717 | 5/1992 | Japan | 118/725 |
| 69137 | 3/1994 | Japan | 118/725 |
| 306588 | 11/1994 | Japan | 118/723 E |

*Primary Examiner*—Robert Kunemund
*Assistant Examiner*—Jeffrie R. Lund
*Attorney, Agent, or Firm*—Janis Biksa

[57] ABSTRACT

A process chamber is disclosed which provides a 360° circular gas/vacuum distribution over a substrate being processed. The substrate being processed is supported on a heated and optionally cooled pedestal assembly. The substrate faces a one-piece gas distribution faceplate being connected to an RF power supply outside the vacuum environment of the processing chamber. A pumping channel view port is provided to verify and confirm instrumentation readings concerning the degree of surface deposition on process chamber internal surfaces. All process chamber wall surfaces facing the region where plasma will be present during processing (except the gas distribution faceplate) are ceramic and therefore highly resistant to corrosion. The pedestal an un-anodized metal is also covered with a loosely fitting ceramic surface having alignment features to maintain concentricity between the wafer support surface of the pedestal and the wafer being processed. A valve body is contained within the wall of the processing chamber helping to reduce the surface area available for condensation of volatile process gas constituents which condense or cool in vacuum passage surfaces and can contaminate the process chamber if allowed to migrate back to it through the vacuum piping.

36 Claims, 14 Drawing Sheets

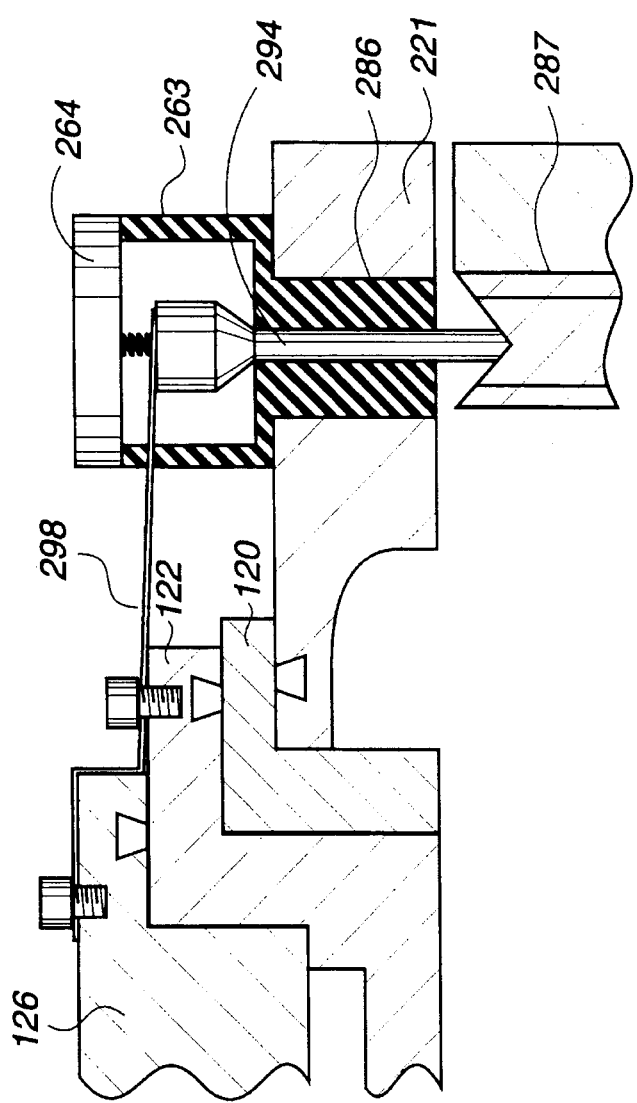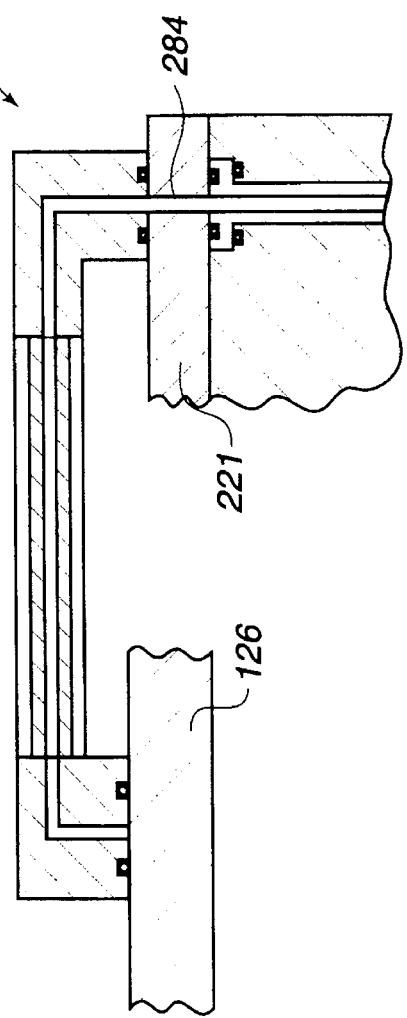

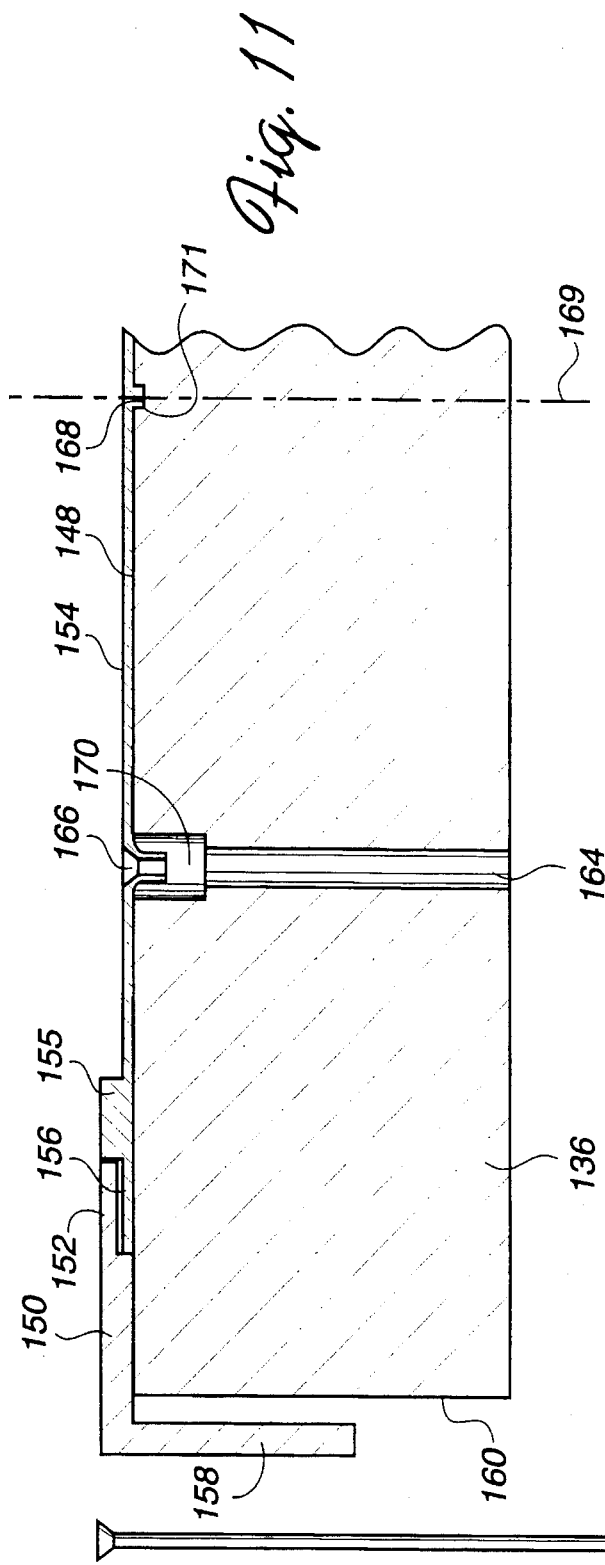
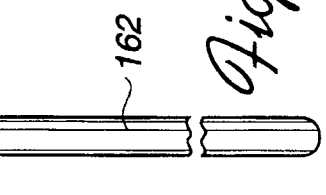

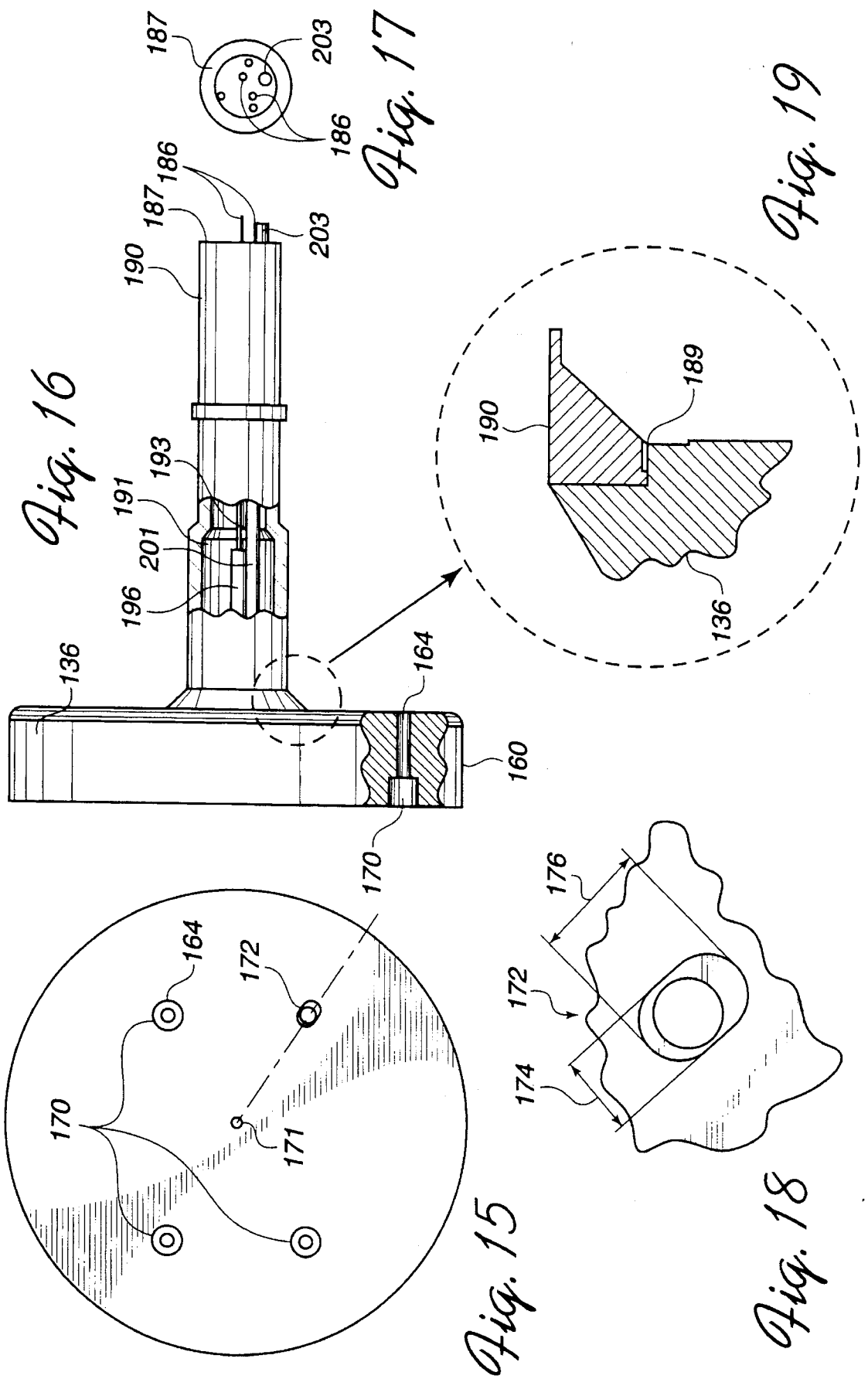

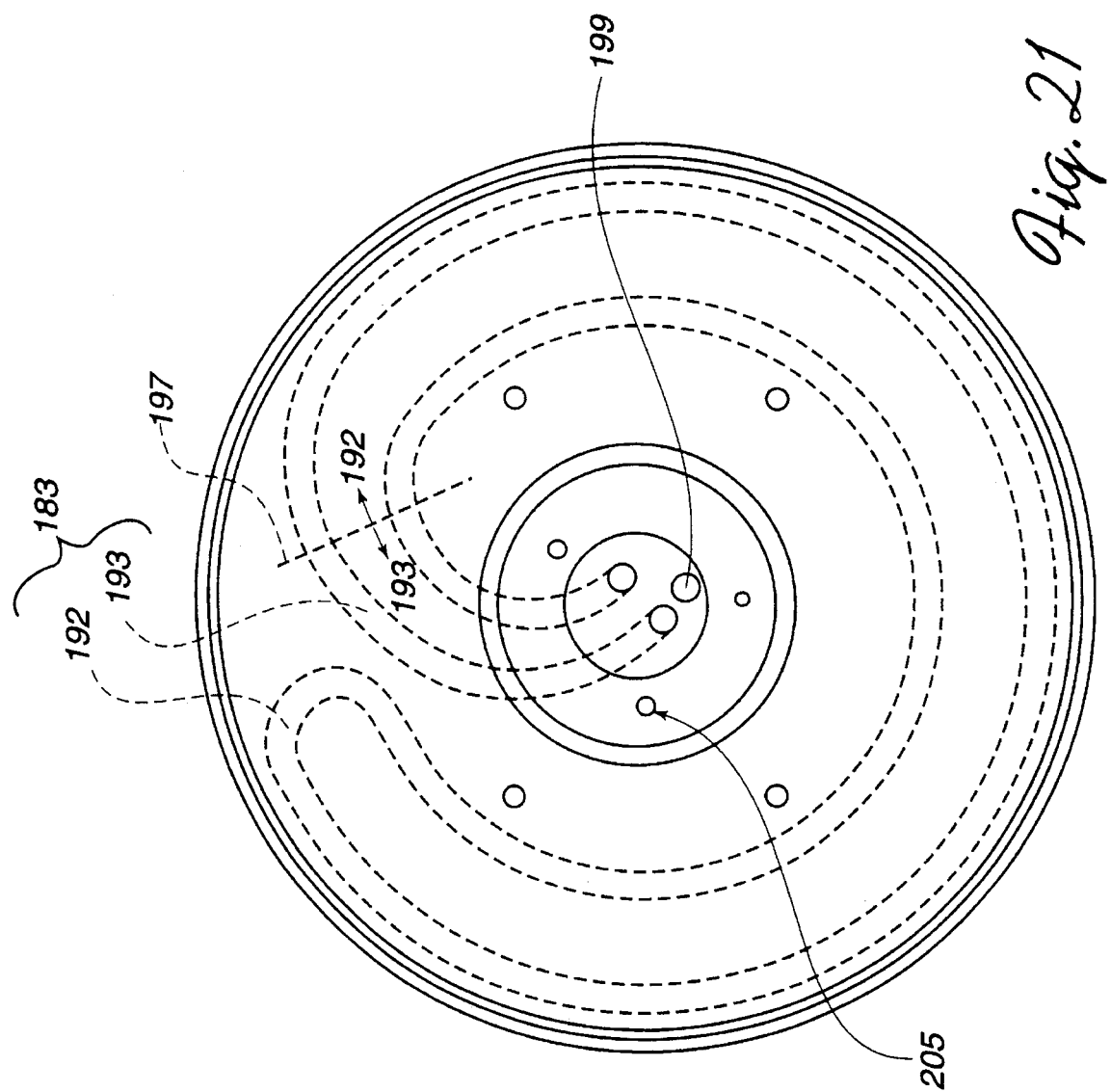
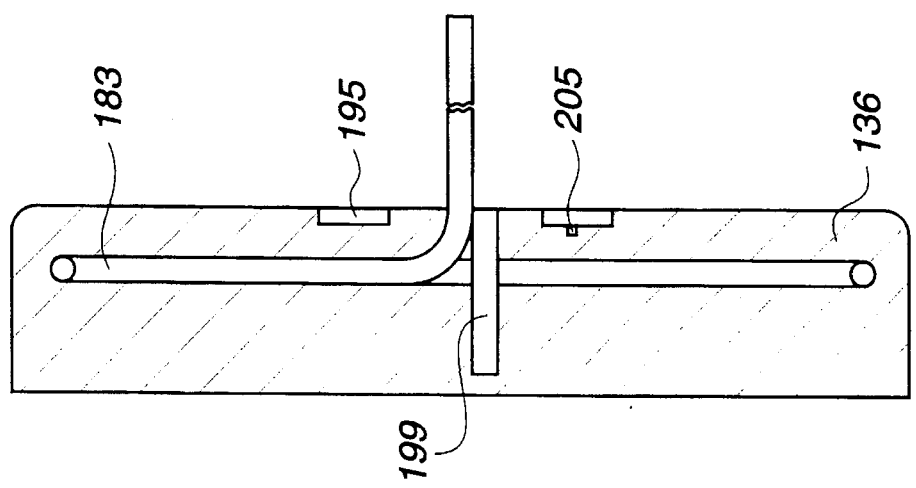

CVD PROCESSING CHAMBER

FIELD OF THE INVENTION

This invention relates to the field of vacuum processing chambers which are widely used in the semiconductor industry, and in particular to CVD (chemical vapor deposition) processing chambers processing chambers used to deposit dielectric, metal, or semiconductor layers on semiconductor substrates using plasma enhanced chemical vapor deposition (PECVD) processes.

BACKGROUND OF THE INVENTION

The process of depositing layers on a semiconductor wafer (or substrate) usually involves heating the substrate and holding it a short distance from the source of a stream of deposition (or process) gas flowing towards the substrate. The flowing gas is excited to a plasma state.

A non-uniform gas flow pattern causes undesirable variations in the uniformity of the coating layer deposited across the surface of the wafer.

Typically the exhaust port opening extending from the process chamber to the vacuum pump leads to asymmetry in the gas flow pattern. In an attempt to restore symmetry many designs provide a pumping channel which surrounds the wafer. However, in many configurations symmetry is not possible because complete encirclement of the wafer is not possible due to interfering structures, e.g. the wafer insertion opening through which a robot arm passes the wafer into the chamber. Such chambers having mechanical asymmetry cannot achieve as high a gas flow symmetry as would be desired on the wafer.

The configuration of the channel and its lack of symmetry about the center of the wafer being processed affect the location at which the orifices can be placed and constrain the design based on the need to avoid other structures and passages in the chamber, e.g. the wafer insertion and removal opening and its path into and out of the chamber. In many instances the orifices to the pumping channel are configured in the chamber at locations which provide a less than ideal gas flow regime from the gas distribution plate to the pumping channel. Greater deposition takes place where the greatest number of molecules contact the substrate surface, i.e., around the vacuum apertures. The process gas flow resulting from such a configuration includes small but measurable variations in the thickness of the material deposited on the wafer.

To aid the deposition on a substrate the substrate support pedestal (susceptor) is heated. Heating is needed to provide reaction energy for the dielectric deposition reaction to occur.

During CVD processing, ideally the injected process gas would deposit only on the substrate surface; however, in reality some gas molecules miss the substrate surface and deposit on process chamber surfaces other than the surface of the substrate. All chamber surfaces inside the processing chamber are susceptible to being coated by the constituents of the deposition gas.

When the build-up of surface deposits on the inside of the processing chamber surfaces becomes thick, flakes or particles of the deposited material can fall from the surface of the chamber onto the substrate being processed, potentially causing a defect. To avoid this problem the inside surfaces of the processing chamber are periodically cleaned by etching (plasma cleaning) their surfaces with fluorine gas to remove the dielectric material deposited by the deposition gas.

It is difficult to evaluate the surface coating conditions inside the chamber. This makes it difficult to detect when the thickness of the coating on the inside surface of the processing chamber is built up to a point where cleaning needs to be done. Determining an optimum need to clean point is a trial and error process which requires reliance on historical data rather than direct measurement or observation. Optimization involves extending the time between cleanings as much as possible without introducing defects. Cleaning interferes with normal production processing.

Erosion, wear, and nodule growth on the anodized aluminum pedestal surface takes place in the chamber as the porous and sometimes nonuniform anodized layer on the susceptor's surfaces is repeatedly exposed to the severe conditions present during wafer processing and during chemical cleaning. Futhermore, variations in the quality of anodization or other corrosion resistant coating on the susceptor can result in undesirable differences in the electrical and chemical (insulating) properties across the susceptor which can cause undesirable variations in the plasma which can contribute to non-uniform deposition on the wafer (substrate) surface.

Bare aluminum surfaces are also used for the susceptor, however such surfaces are subject to fluorine gas attack which results in an aluminum fluoride (AlF) film growth causing process parameters to drift. To recover the process the susceptor surface is often scraped. The aluminum fluoride film is subject to cracking and peeling causing particle contamination.

At some point in the vacuum line between the chamber and the vacuum pump, a vacuum shut off valve typically is provided which when closed acts as a limit of the process chamber containment. Volatile contaminants which are maintained in their vapor state under the high temperatures of an active processing chamber can and do undesirably condense on the walls of the cool vacuum piping at some distance from processing area of the processing chamber, but still within the containment limit of the processing chamber defined by the vacuum valve. During no flow conditions these contaminants can migrate back into the processing part of the chamber to undesirably contribute to its contamination.

Other sources of contamination in the conventional design are electrical connectors and threaded mechanical fasteners within the process chamber vacuum environment. Turning and tightening of the threaded fasteners, or arcing at the electrical connectors, generates contaminants which may find their way to the substrate and contaminate it. To minimize the effect of contamination in the actual process setting, a procedure which is often used after a processing chamber has been reassembled is to process a large set of sample wafers (for example ten, twenty or thirty) until measurements show that process conditions in the processing chamber have stabilized and that any contaminants introduced as a result of the disassembly and reassembly of the processing chamber have been eliminated. This procedure undesirably prolongs the time needed to begin normal processing once a chamber has been re-assembled.

Elimination of the factors which contribute to nonuniformities in material deposition and contamination or possible contamination is desirable.

SUMMARY OF THE INVENTION

A device and method according to the present invention overcomes many of the problems of the prior art described above.

A 360° circular pumping channel/plenum is provided all around the location of wafer. The pumping channel is formed in a space in the wall of the processing chamber and in particular between the perimeter of the bottom side of the lid of the chamber and the top of the inside perimeter of the lower chamber body. The circular pumping channel provides a manifold (i.e., a nearly isobaric passage) to conduct the process gas around the processing chamber to a single vacuum connection on one side of the chamber. This is in comparison with the prior art pumping channel which only partially surrounds the process chamber.

The passage for the process gas from the plasma space of the processing chamber to the exhaust plenum (pumping channel) is through a continuous uniform circular gap (slot) all around the processing chamber. The slot (a gas flow choking orifice/slot) is formed between a process chamber lower body and the process chamber lid. Process gas directed into the processing chamber through the uniformly distributed orifices in the gas distribution faceplate is uniformly evacuated from the perimeter of the chamber through a slot gap that is located a uniform predefined distance from the edge of the substrate all around the substrate being processed to promote maximum uniformity in the thickness of material deposited.

The condition (including thickness) of the material built-up on the inner surfaces of the processing chamber can be directly observed by viewing the material deposited on the inside of a window from the outside of the chamber. The plasma in the chamber can be indirectly viewed through the window. The window is located adjacent to the point of convergence of the process gas flow from the circular exhaust plenum to the vacuum system. The window is located to view a vacuum duct lateral extension portion, as the process gas is being drawn to the vacuum system from the exhaust plenum it passes in front of the view window port over which the window is secured before it reaches a downstream vacuum shut off valve.

An unanodized metallic heated pedestal/susceptor (wafer support plate) is provided to support a wafer being processed. The pedestal construction provides a uniform grounded potential across its full width without changes in electrical properties, e.g., impedance, due to variations in surface treatment, e.g., anodization. This configuration also eliminates the extra bake out time needed to effectively evacuate the porous surfaces resulting from surface treatment when compared to the time needed to bake out relatively smoothly finished bare metal surfaces.

The wafer support platter of the pedestal (preferably aluminum) is heated using a double full turn single loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of the pedestal.

In another configuration a wafer support platter is also cooled, as required, by an embedded cooling tube. The cooling tube assists in accelerating the cooling of the pedestal prior to performing maintenance. The cooling tube runs in a loop also along the path of a circle concentric to the paths of the heater elements.

The pedestal is supported in the processing chamber by a central hollow stem. Conductors run through the core to the embedded heater in the wafer support platter (pedestal heater) along with a thermocouple to sense the pedestal heater temperature, and when desired the cooling tube also runs through this core. The vacuum seal to the stem is made at the perimeter of the bottom end of the stem. The bottom end of the stem is also connected to ground.

To prevent corrosion of the untreated metal susceptor, the top of the pedestal is covered with a loosely fitting although precisely located ceramic liner. The center top portion of the pedestal heater liner is one material, preferably an aluminum nitride ceramic cover liner plate having a high thermal conductivity so that the thermal energy of the heated pedestal can be transferred through the aluminum nitride to raise the temperature of a wafer being processed. The circumferential edge of the pedestal heater liner is an "L" shaped aluminum oxide ceramic skin which protects the outside upper perimeter of the pedestal heater from corrosion during PECVD processes.

Maintaining the position of the wafer being processed in the center of the platter in spite of the difference in coefficients of thermal expansion between the pedestal platter (made of aluminum) and the covering liners (made of ceramics) is accomplished by using fixed center joint with a tangentially constrained, but a radially sliding slot fit. The pedestal includes wafer lift pin through holes and counterbore cavities to receive a ceramic cover liner with downwardly extending hollow studs with countersink type depressions at the surface of the liner to guide and retain a shaft and end of the wafer lift pins (collectively known as retaining features). A center downwardly extending solid stud acts as the center anchor between the center of the cover liner and the center of the pedestal. One of the downwardly extending hollow studs is tangentially constrained, but allowed to slide radially along a line between its location and the center of the pedestal. The other downwardly extending hollow studs are disposed in large counterbore holes at their respective locations in the pedestal which prevents interference between pieces due to differential thermal expansion during the range of process temperatures.

The pedestal is supported on a yoke support plate through three triangularly placed adjustable screw connections. The yoke permits adjustment of the pedestal attitude to make its wafer support face parallel to the gas distribution faceplate in the processing chamber.

The walls of the processing chamber surrounding the area where plasma is present during processing are lined with a ceramic dielectric thus protecting the metal wall of the chamber from the deleterious effects of the exposure to the plasma and moving the ground potential of the wall of the chamber further away from the primary electrode (gas distribution faceplate) of the plasma to assist in making the plasma more uniform and stable to and beyond the radius of the perimeter of the wafer being processed.

The generally uniform thickness of the cover lining when the wafer is in position provides a generally uniform impedance for the electrical path from the primary RF electrode (the gas distribution faceplate) to ground (the pedestal), this uniform impedance to ground avoids uneven deposition due to a differential in the plasma quality between locations.

The location where plasma is present during processing is surrounded by ceramic pieces generally impervious to the effect of the plasma, except for the gas distribution faceplate. The top of the ceramic liner surrounding the pedestal is located opposite from and a short distance away from the bottom surface of a ceramic isolator ring in the lid of the processing chamber. This short distance is the gap of the continuous circular 360° slot through which the process gas is drawn into the 360° circular pumping channel (exhaust plenum). The walls of the processing chamber surrounding the pedestal are in close proximity to the edge of the pedestal heater supporting the wafer being processed. The ceramic liner, e.g., a series of ceramic rings, lines only the walls adjacent to the location of the plasma. These rings, just as all the other ceramic pieces are easily removable for cleaning and/or for replacement, as appropriate.

The processing chamber lower body includes vacuum passages which lead from the lateral extension portion of the exhaust plenum to a vacuum shutoff valve fitted within the lower valve body and is configured to include a vacuum shut-off valve seat in the lower body such that when the vacuum to the processing chamber is shut off, there is a very short passage between the valve seat sealing the process chamber and the processing chamber space surrounding the pedestal heater which could become contaminated and in which contaminants could be caught during, before, and after processing. By having the vacuum valve within the chamber body, as the chamber body is heated all vacuum passages ahead of the vacuum valve in the chamber body are also heated. This configuration reduces or eliminates the likelihood that contaminants might condense on surfaces of vacuum passages upstream of the vacuum valve and migrate back into the processing chamber during a time when the valve is closed.

Contamination due to RF surface contacts arcing in the processing chamber are eliminated by providing a one piece gas distribution plate which passes through the vacuum seal of the processing chamber and connects to an RF power source outside the processing chamber, so that arcing if it occurs is not inside the processing chamber. The lid of the processing chamber includes a one piece open top hollow flanged cylinder shaped gas inlet distribution plate which seals the lid inside the hollow cylinder and on the bottom of its flange facing the lid. When an RF power connection is made to the top of the flange of the gas distribution plate there are no "in-vacuum" connections as known in the prior art which might generate contaminants within the processing chamber during a PECVD process.

A configuration of the processing chamber according to the invention provides for no threaded fasteners inside the confines of the processing chamber whose limits begin outside the gas distribution faceplate and extend to the limits of the vacuum seal of the chamber and the seal of the vacuum system shut off valve. The fasteners for the pedestal lift are all outside the processing chamber. Once a vacuum is present in the chamber, the outside atmospheric pressure provides the force needed to maintain the vacuum seals in a stacked series of layers of the processing chamber.

BRIEF DESCRIPTION OF THE DRAWINGS

FIG. 4 shows a cross section of an RF power connection to the top of the gas distribution faceplate according to the invention;

FIG. 5 shows a cross sectional view of the process gas feed through from the lower body of the processing chamber through an insulated bridge member and in the inlet gas manifold in the center of the gas distribution faceplate;

FIG. 11 shows a simplified close-up cross-section of a configuration of a pedestal according to the invention;

FIG. 12 shows a close up view of the configuration of FIG. 11;

FIG. 13 shows the side view of a lift pin for use in the configurations as shown in FIGS. 11 and 12;

FIG. 15 shows an end view of a pedestal (heater) as shown in FIG. 16;

FIG. 18 shows a close up of the elongated slot guidance feature 172 as shown in FIG. 15;

FIG. 16 shows a side and partial cross-sectional cutaway views of a pedestal heater according to the invention;

FIG. 17 shows a bottom end view of the pedestal heater of FIG. 16;

FIG. 19 shows a partial view of a cross section according to the invention showing one configuration of the connection between the stem and the platter of the pedestal;

FIG. 20 shows a side cross-sectional view of the imbedded pieces and features of a pedestal heater wafer support plate according to the invention;

FIG. 21 shows a bottom view of the pedestal heater element configuration as shown in FIG. 20;

DETAILED DESCRIPTION OF PREFERRED EMBODIMENTS

1. Overview of Deposition Chamber

Figure 1:
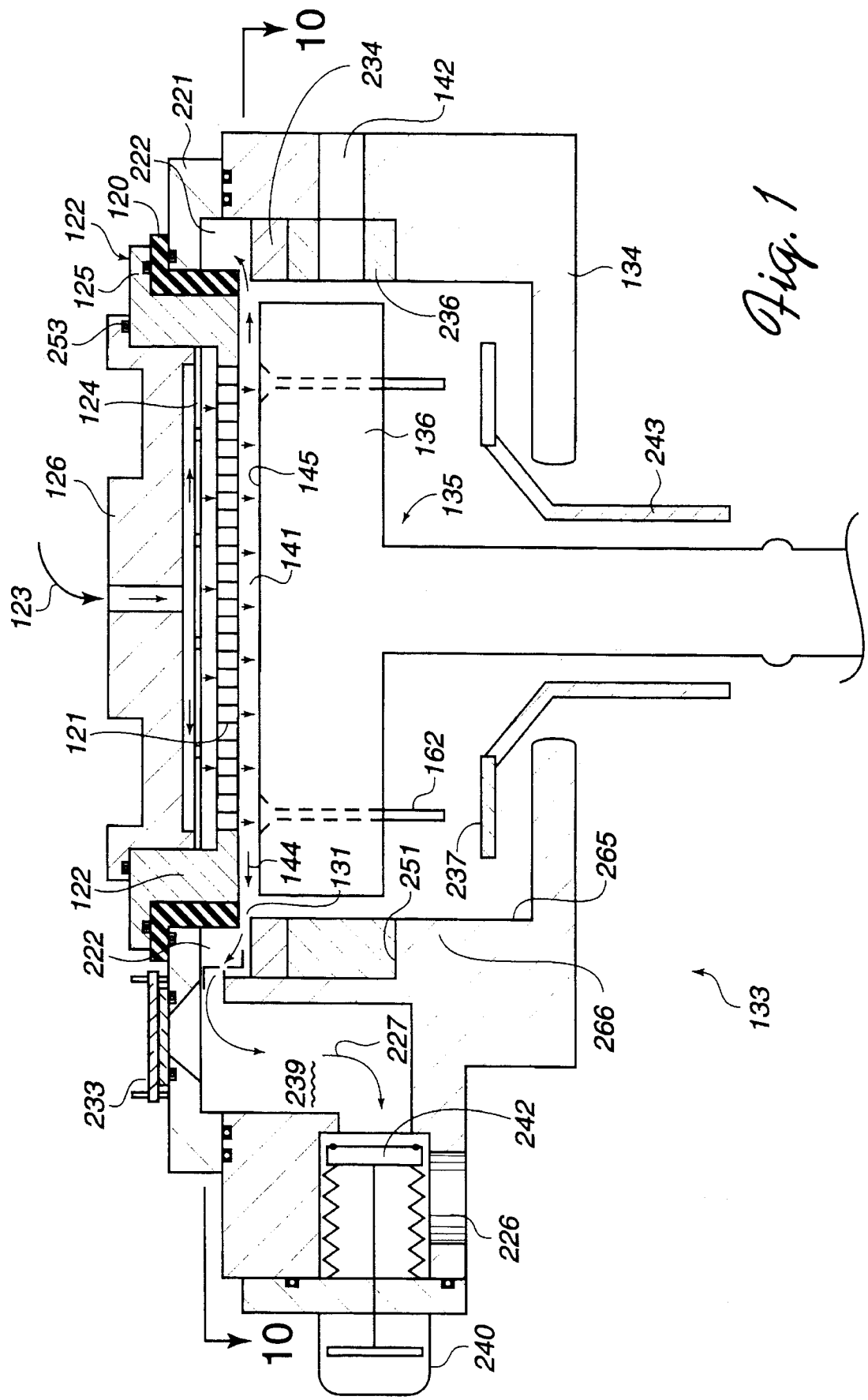
FIG. 1 shows a cross-section of a PECVD processing chamber according to the invention.
Figure 2:
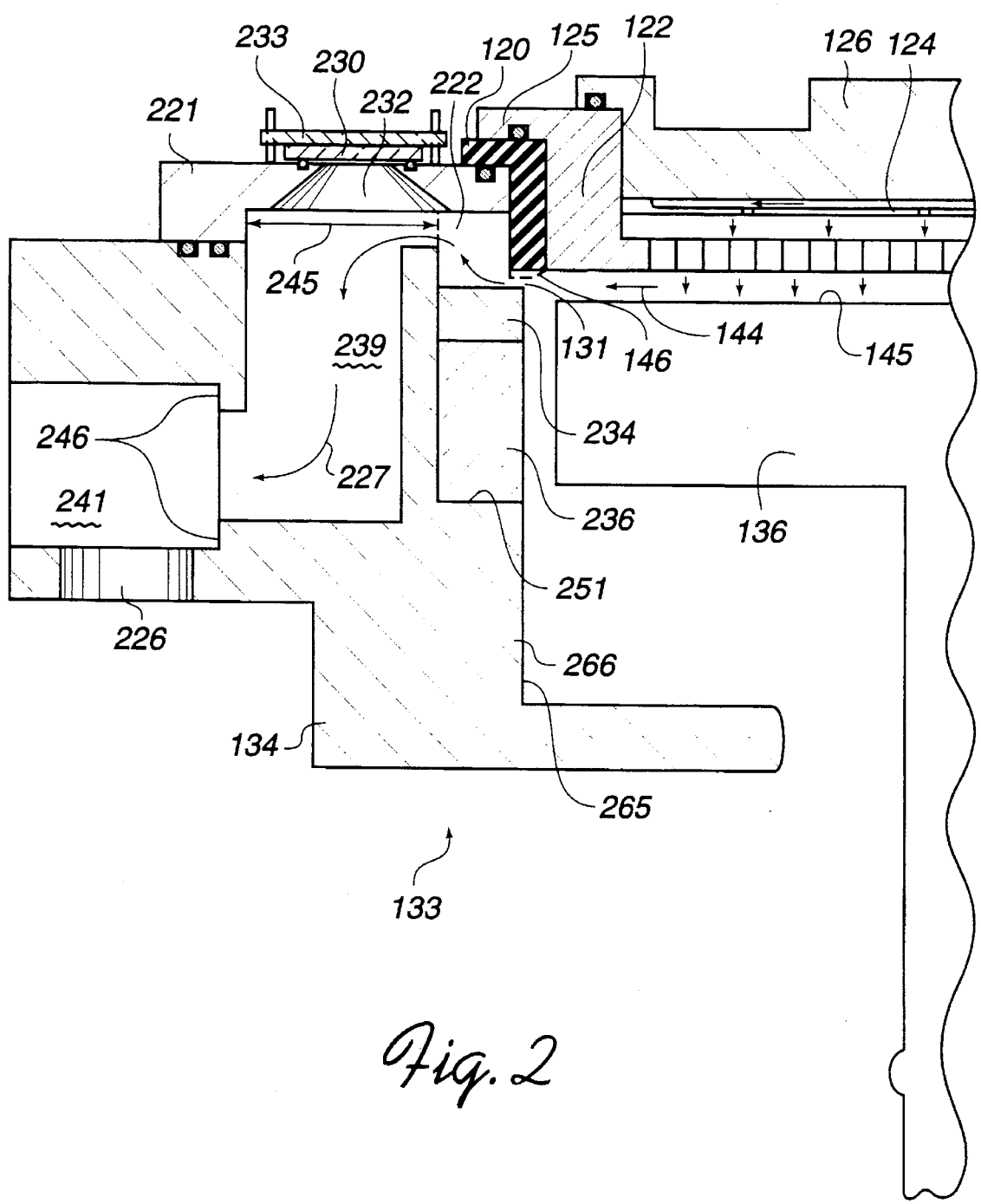
FIG. 2 shows a close-up view of the left side of the simplified processing chamber shown in FIG. 1.
Figure 3:
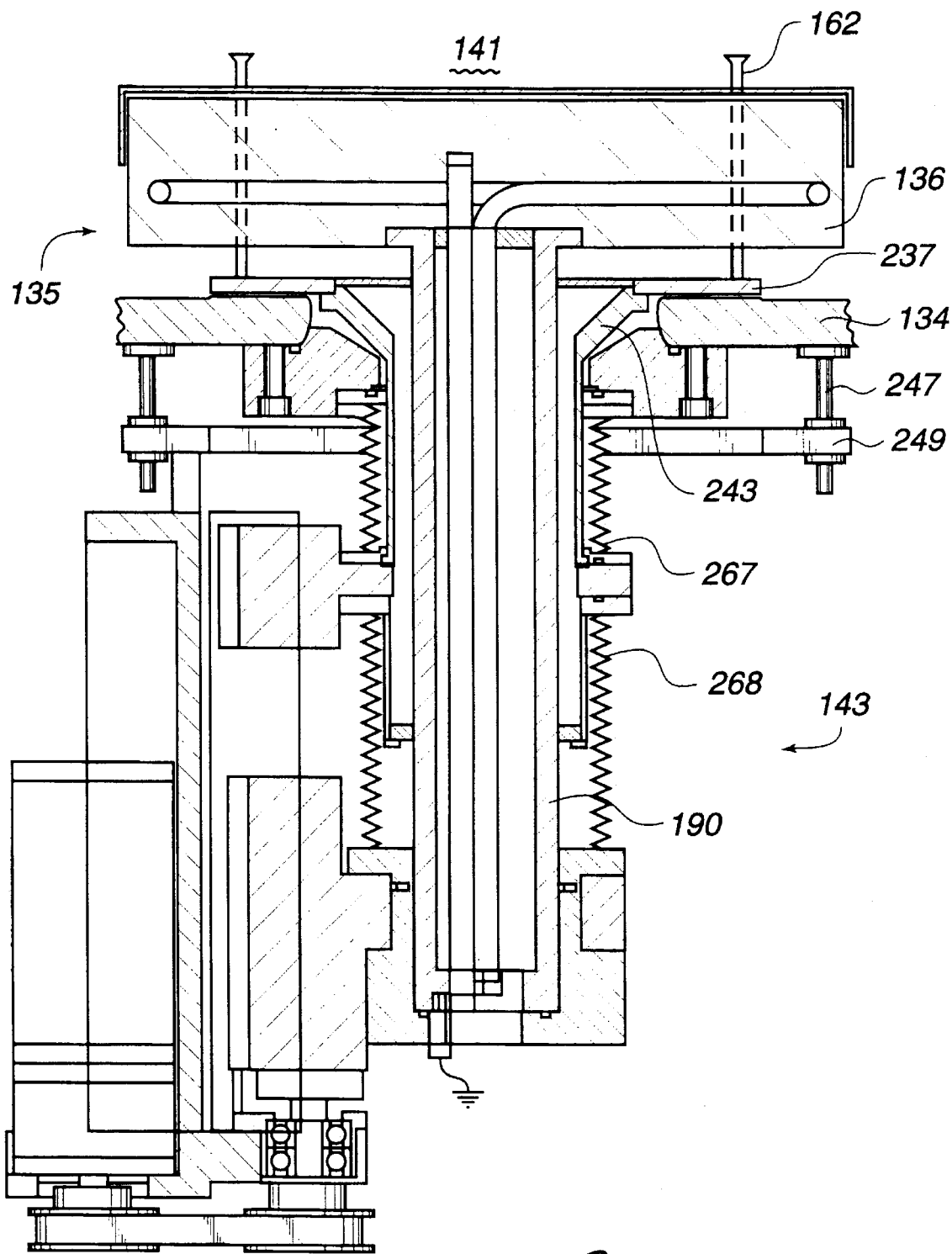
FIG. 3 shows a cross sectional view of the pedestal lift mechanism to be attached to the bottom of the processing chamber of FIGS. 1 and 2.

An overall cross-sectional view of a preferred embodiment of a deposition process chamber according to the invention is shown in FIGS. 1–3. (See also FIG. 7, an exploded perspective view without the chamber lid.) A heated pedestal 136 centered within the process chamber supports a semiconductor wafer or substrate (not shown) at the wafer processing location 141 on the flat (or slightly convex), circular face 145 of the pedestal. A lift mechanism 143 (FIG. 3) raises and lowers the heater pedestal assembly 135 and its wafer lift pins 162 as wafers are transferred into and out of the body of the chamber by a robot blade (not shown) through an insertion/removal opening 142 in the side of the chamber.

The pedestal face 145 is parallel and spaced closely to a process gas distribution faceplate 122 through which process gases enter the chamber. An RF power supply (not shown) applies electrical power between the gas distribution faceplate 122 and the pedestal so as to excite the process gas mixture to form a plasma within the cylindrical region between the faceplate and the pedestal. The constituents of the plasma react to deposit a desired film on the surface of the semiconductor wafer supported on the face 145 of the pedestal. The remainder of the gas mixture, including reaction products, is evacuated from the chamber by a vacuum pump (not shown).

The aluminum pedestal 136 and the inner surface 265 of the cylindrical side wall 266 of the chamber are lined with a ceramic material (rings 236, 234) to resist corrosion and adjust the degree of impedance encountered by the plasma as the RF circuit (not shown) seeks to complete its circuit to ground potential. The improved uniformity of gas distribution across the wafer and the circular configuration of the chamber 133 and its symmetrical liners (236, 234) help to make the plasma in the chamber more uniform and stable to contribute to an improvement in the uniformity of the thickness of material deposited on the wafer being processed.

Sources of contamination inside the chamber are reduced or eliminated by manipulating all chamber internal movable components through bellows 267, 268. Contamination from arcing inside the vacuum containment of the chamber is eliminated by moving the RF power connection out of the vacuum environment and to the atmosphere side of the vacuum seals. Contamination from the particles generated by threaded connectors is also avoided by eliminating threaded connections within the confines defined by the face of the gas distribution faceplate and the vacuum seals of the chamber 133. Contamination due to flaking of excessive deposit build-up on the walls of the chamber is minimized or eliminated by being able to directly view the build-up of deposits on the inside of the chamber surfaces and schedule cleaning cycles before the build up is large enough to flake off contaminants. A single crystal sapphire window 230 is positioned over the view port 232 which is positioned at the area of gas flow convergence from the processing chamber exhaust plenum to the vacuum port 226. The maximum build-up of deposited material occurs at the area of gas flow convergence.

2. Exhaust Manifold

As stated above, during a deposition process the semiconductor wafer (not shown) is supported on the face 145 of the heated pedestal 136. The face 145 is parallel and spaced closely to a process gas distribution faceplate 122 having holes 121 through which process gases enter the chamber. More specifically, deposition process gases (indicated by arrow 123) flow into the chamber through an inlet manifold 126 through a conventional perforated blocker plate 124, and through the holes 121 in a conventional flat, circular gas distribution faceplate 122 (indicated by small arrows 144 in FIGS. 1 and 2). An RF power supply (not shown) applies electrical power between the gas distribution faceplate 122 and the pedestal so as to excite the process gas mixture to form a plasma within the cylindrical region between the faceplate and the pedestal. (This region will be referred to herein as the "reaction region".) The constituents of the plasma react to deposit a desired film on the surface of the semiconductor wafer supported on the face 145 of the pedestal. The remainder of the gas mixture, including reaction products, is evacuated from the chamber by a vacuum pump (not shown).

Specifically, the gases are exhausted through an annular, slot-shaped orifice 131 surrounding the reaction region and into an annular exhaust plenum 222. The annular slot shaped orifice 131 and the plenum 222 are defined by the gap between the top of the chamber's cylindrical side wall 266 (including the upper dielectric lining 234 on the wall) and the bottom of the circular chamber lid 221 (including the dielectric insulator (isolator) 120 between the lid 221 and the perimeter flange 125 of the gas distribution plate 122). As will be discussed more fully below, the 360° circular symmetry and uniformity of the slot orifice 131 and the plenum 222 are important to achieving a uniform flow of process gases over the wafer so as to deposit a uniform film on the wafer.

From the exhaust plenum 222, the gases flow underneath a lateral extension portion 245 of the exhaust plenum (FIG. 2), past (as shown by the arrows 227) the view port 232, through a downward-extending gas passage 239, past a vacuum shut off valve 240 (whose body is integrated with the lower chamber body 134), and into the vacuum outlet port 226 which connects to the external vacuum pump (not shown).

Figure 10:
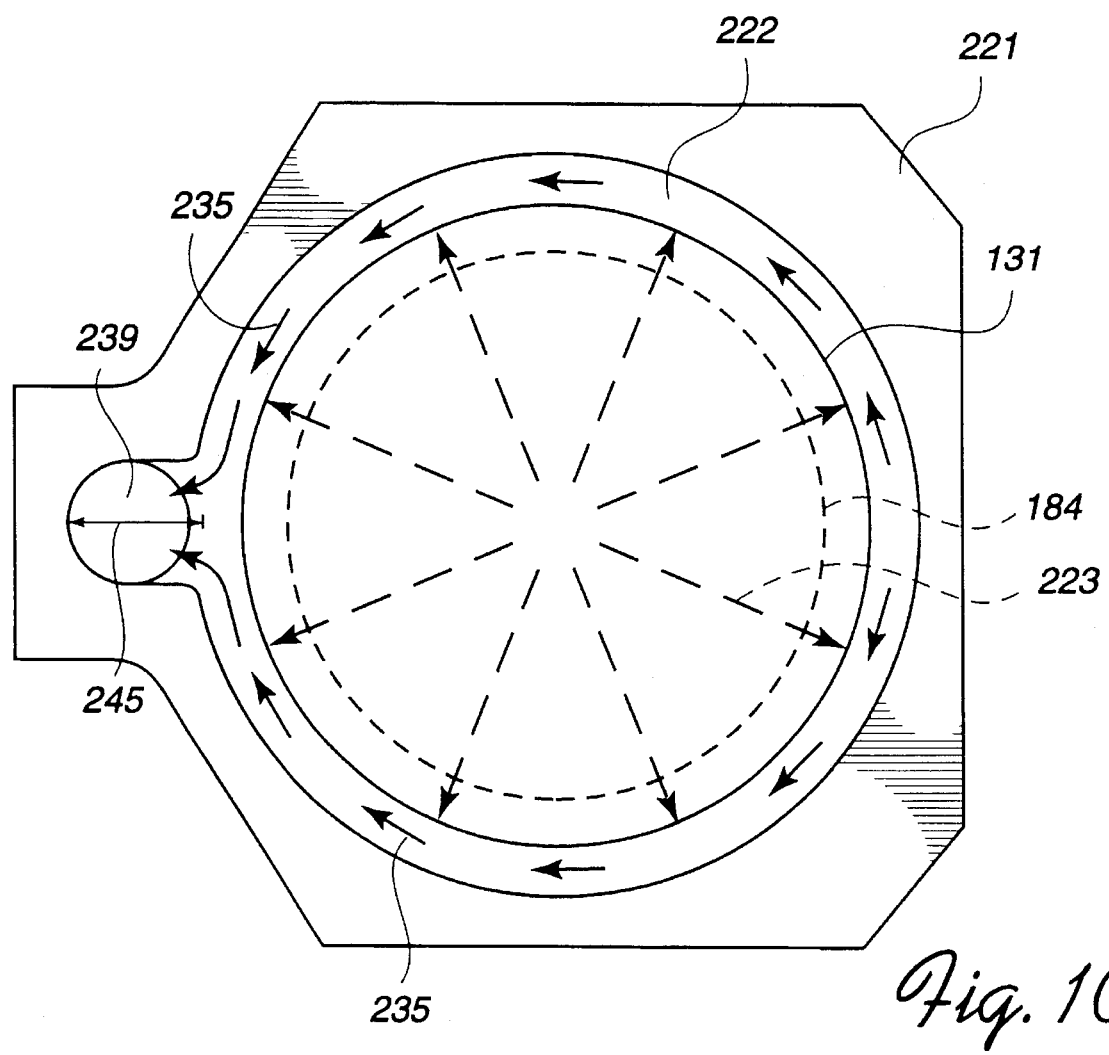
FIG. 10 shows a cross-section of FIG. 1 taken at 10—10 using arrows to show the hypothetical gas flow pattern in the processing chamber.

FIG. 10 is a sectional view of FIG. 1 taken at 10—10 through the plane of the slot orifice 131, looking down on a wafer 184 (shown in phantom), showing the exhaust plenum 222 completely surrounding the edge of the pedestal and wafer 184. The arrows 223 depict that the process gas flow from the gas distribution plate 122 to the exhaust plenum 222 is uniform and symmetrical. The uniform gas flow pattern results from two important design features.

The first design feature is that the slot 131 and the exhaust plenum 222 have circular symmetry, and the slot 131 is uniformly spaced from the perimeter of the wafer 184, or equivalently, from the perimeter of the heated pedestal 136. In the illustrated preferred embodiment, which is designed for processing wafers of 8 inch (203.2 mm) diameter, the pedestal diameter is 10.3 inches (261.6 mm), and the inner diameter of the slot orifice 131 is 10.5 inches (267 mm).

The second design feature overcomes the asymmetry that normally would be created by the outlet gas passage 239 from the plenum 222 to the vacuum pump (not shown). In conventional designs, the pressure differential between the portions of the plenum closest and farthest from the outlet gas passage 239 tends to produce a non-uniform process gas flow pattern; specifically, the gas flow rate tends to be greatest over the region of the wafer 184 closest to the outlet gas passage (e.g., 239). In conventional designs this tendency must be compensated for by providing fewer or smaller orifices in the portion of the exhaust plenum closest to the vacuum pump outlet. The resulting geometry is not completely uniform.

Our invention achieves a symmetrical and uniform geometry by making the slot 131 sufficiently narrow in the axial direction, and sufficiently long in the radial direction, to provide a pressure drop across the slot much greater than the pressure differential within the exhaust plenum 222. The pressure drop across the slot is preferably at as great as possible, and more preferably at least ten times or more greater than the pressure differential within the exhaust plenum 222. Consequently, the gas flow rate from the reaction region into the slot 131 is uniform around the entire 360° circumference of the slot, thereby achieving circular uniformity of film deposition on the wafer 184.

The pressure drop across the slot 131 is proportional to the axial width of the slot (gap) and the radial length of the slot (length of opposed slot walls). The radial location (diameter) of the slot is generally approximated by the diameter of the wafer to be processed in the chamber. For example, in the illustrated preferred embodiment, the chamber is designed to process wafers of 8 inch (203.2 mm) diameter, and the slot orifice 131 has a 10.5 in. (267 mm) inner diameter. To achieve the desired pressure drop across the slot 131, the slot has a 0.150 in (3.8 mm) axial width (slot gap) and a 0.5 in (12.5 mm) radial length (length of opposing walls of the slot). The diameter of a typical heated pedestal 136 with ceramic coating is 10.3 in. (261.6 mm). The inside and outside diameters of a typical chamber liner (e.g. 234, 236) are approximately 10.5 in. (266.7 mm) and 12.5 in. (317.5 mm), respectively. The inside and outside diameters of the isolator surfaces facing the ceramic liner are 10.01 in. (254.25 mm) and 11.0 in. (279.4 mm), respectively. The length of the narrowest passage of the radial slot being approximately 0.5 in. (12.7 mm) whose length can be adjusted by changing the relative diameters of the pieces and their overlap. The slot gap 131 can similarly be changed. A beveled surface can be provided on the bottom surface of the isolator 120 as shown by the dashed lines 146 in FIG. 2.

The above described gap (slot) orifice 131 configuration is useful for example when the chamber internal pressure is maintained at 4.5 torr and a gas flow of 285 sccm $SiH_4$, 140 sccm $NH_3$ and 4000 sccm $N_2$ is provided to a processing chamber operating at a temperature of approximately 400° C.

3. Exhaust Viewing Port

Excess process gas constituents and reaction products of the deposition process generally react to deposit an undesirable film of contaminants on any components of the process chamber exposed to the exhaust gases. It is necessary to clean the chamber components periodically to remove the contaminant film before it becomes thick enough to flake off into particles than could contaminate the semiconductor wafer.

An observation or viewing port 232 in the exhaust passage permits viewing the extent of build up of contaminants during a deposition process, and permits viewing the progress of the removal of the contaminants during a cleaning process.

Gas flow from the exhaust plenum 222 to a vacuum duct lateral extension portion 245 is shown by the arrows 235 (in FIG. 10). Referring now to FIG. 2, the gas flowing from the 360° circular exhaust manifold (exhaust plenum) 222 to the gas outlet passage 239 passes in front of the conical shaped viewing port 232 bored into a lateral extension portion 245 of the pumping channel lid 221. The port 232 is covered by a pumping port view window (preferably made of single crystal sapphire) 230 covered and held in place by a UV filter glass 233 through which the glow of the gas plasma at the substrate processing location can be seen indirectly.

The degree of contamination or deposition on the inside surfaces of the processing chamber can be evaluated by directly viewing the buildup on the inside of the window 230. The vacuum duct lateral extension portion 245 in front of the view window port 232 is at the area of convergence (downstream end) of the gas flow from the processing chamber to the vacuum system. Consequently, the build up on its surfaces provides a good indication of the level of contamination (deposition on the surface) of the processing chamber. When the inside of the view port becomes completely covered with deposited material, it can be safely assumed that the surfaces of any chamber component near the reaction region is also coated to a thickness no greater than that of the deposits on the inside of the view window 230.

Deposition thickness on the surface of the view port is greater than the deposition thickness on surfaces in the chamber because the remnants of deposition material exist even after the gas has left the processing chamber and entered the exhaust plenum. These gas remnants combine and precipitate as particles on surfaces of the exhaust plenum and downstream surfaces of the gas passage creating contaminant build up on internal gas passages. The thickness of the deposited film of contaminants increases progressively as the gases move away from the reaction region (where more molecules are available to form particles). Accordingly, the amount of film deposited on the surfaces observable from the viewing port (located at the region of gas flow convergence from the exhaust plenum to the vacuum system) approximates the amount of the greatest thickness of contaminant film deposited on other components closer to the reaction region.

Similarly, when an etch cleaning is taking place, in addition to the standard fluorine sensing instruments which sense the end point of the etching process, the cleanliness of the inside of the pumping port view window 230 provides direct visual confirmation of instrument readings.

4. Exhaust Valve

An exhaust shutoff valve is located within the body of the process chamber immediately outside the reaction region. This location has at least two advantages. Because the valve is integral with the chamber body, the shutoff valve and the passageway between the valve and the reaction region are heated along with the other chamber components during plasma processing. Maintaining the valve and passageway at an elevated temperature deters condensation of the exhaust gases on the surfaces of these components, so that the exhaust gases are pumped out of the chamber before they can condense to produce potentially contaminating particles. If allowed to condense in the exhaust passageway between the reaction region and the exhaust shutoff valve, such particles could diffuse back into the reaction region during periods when the gas flow is off, such as when a wafer is being carded into or out of the chamber.

A second advantage of our design is that it minimizes the volume of the passageway between the shutoff valve and the reaction region, thereby minimizing the volume of exhaust gases which remain in the chamber when the exhaust shutoff valve is closed at the end of a deposition process. Such remaining gases can migrate back into the reaction region and contaminate subsequently processed wafers, so it is important to minimize their volume.

As shown in FIGS. 1 and 2, the process chamber lower body 134 includes a downwardly extending gas passage 239 immediately downstream of and below the viewing port 232 in the chamber lid 221. The gas passage 239 guides the flow of process gas to a cylindrical valve cavity 241 in the chamber body 134. The valve cavity 241 has a valve seat surface 246 at the circular opening between the valve cavity 241 and the gas passageway 239. A valve piston 242 moves axially within the cavity. In the "off" position, the piston abuts the valve seat 246, and an 0-ring on the face of the piston forms a seal which prevents gas from flowing out of the passageway 239. In the "on" position, the piston 242 retracts away from the valve seat so as to expose vacuum outlet port 226, which leads to a vacuum pump (not shown). (See FIG. 7 for an external perspective view.) A bellows forms a vacuum seal between the piston 242 and a plate on the outer wall of the chamber on which the valve actuation mechanism is mounted. The valve actuator, piston, and bellows may be any conventional design.

During a deposition process, the plasma heats the entire process chamber, including the walls of the chamber body 134 surrounding the exhaust passageway 239 and the shutoff valve 240. When the plasma is not turned on, a hot liquid is circulated through the walls of the process chamber to maintain the chamber at an elevated temperature (not shown). This heating beneficially reduces or eliminates condensation of undesirable reactant products and improves the elimination of volatile products of the process gases and other contaminants which might contaminate the process if they were to condense on the walls of cool vacuum passages and migrate back into the processing chamber during periods of no gas flow.

Making the vacuum system shut-off valve 240 integral with the body 134 of the processing chamber also causes the shut-off valve 240 to be heated together with the processing chamber during processing. This reduces condensation of volatile gas products on valve surfaces. When the gas flow process is halted and connection to the vacuum system is to be shut, the vacuum valve closes on seat surfaces 246 thereby isolating only a very small gas volume between the seat surfaces 246 and the central processing chamber. This arrangement minimizes or nearly eliminates the possibility that volatile contaminants which might have condensed on the walls of the cooler downstream vacuum piping can migrate back through the vacuum on/off valve and past its valve seat 246.

5. Pedestal Heater

FIG. 16 shows the resistively heated wafer support pedestal 136 attached to the support stem 190. FIGS. 20 and 21 show the heating dement in more detail. The pedestal or platen 136 is a disc-shaped body fabricated of high purity 100.1 grade, unanodized, cast aluminum. A heater coil is sheathed in a heat tolerant, electrically insulating coating such as Stainless Steel or Inconel tube surrounding a magnesium oxide filler material encasing a nichrome heater element is embedded in the pedestal during the casting process. A heater coil assembly 183 includes a heater element 192 connected to its conductor lead wires 193 within the platen 136 by a cold junction approximately at the dashed line shown by 197. That is, a nichrome heater wire 192 is bonded to a copper wire 193 at approximately this boundary 197 so that the center of the base is not heated. However, all of the wires of the heater coil, whether primarily resistive or primarily conductive, are sheathed in the continuous insulating coating (such as described above) which tolerate high temperatures so as to withstand casting of the aluminum heater body 136.

The pedestal 136 includes an annular groove 195. A pedestal support stem 190 (FIG. 16) having a hollow core 191 is configured to mate (aligned according to alignment guides 205) with the circular groove 195 (FIG. 20) to provide a stem for the pedestal 136. The mating joint for these two pieces can generally be seen in the FIG. 19. A peripheral electron beam weld at the joint 189 is made between the two pieces to provide a vacuum tight joint such that the hollow core 191, shown in the cutaway view of FIG. 16, is at ambient (atmospheric) pressure. FIG. 16, shows a thermocouple tube 201 and the end of the coating 196 of the heater coil 183 and its conductor wiring leading to wire ends 186. A vacuum seal and ground connection for the pedestal stem 190 is made at its bottom surface 187 (FIG. 17) and connections to heater wire ends and connections 186 and the thermocouple tube end 203 are made at atmospheric conditions. The end of the thermocouple tube passage terminates in the thermocouple opening 199 of the pedestal 136.

As can be seen in FIG. 21 the routing of the heater coil 183 embedded in the pedestal base 136 provides a single generally parallel loop running along lines of circles concentric to the center of the pedestal 136. This loop pattern provides heating to maintain a generally uniform temperature across the width of the plate while allowing for heat losses. Care must be exercised during casting to avoid placing the heater coils at locations where the lift pin holes must be placed. The outer portion of the heater element is run at a diameter of approximately 9.5 in. (241.3 mm), the inner portion of the heater element is run at a diameter of approximately 7.0 in (177.8 mm), a wafer support plate having a typical diameter of 10.0" (254 mm). the heater element is located 1.5 in. (38.1 mm) from the top surface of the pedestal 136.

6. Pedestal Cooling

Figure 22:
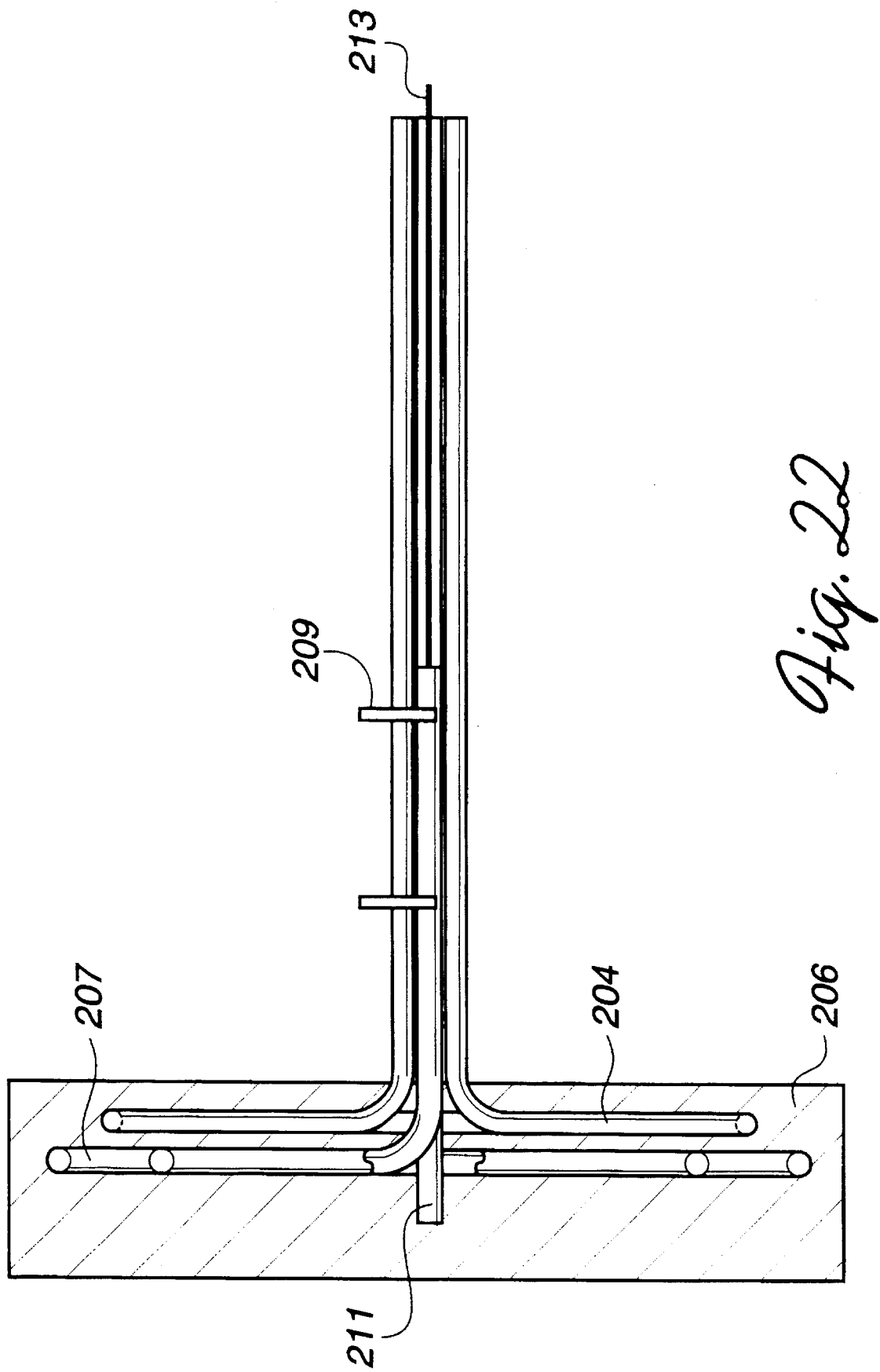
FIG. 22 shows a side cross-sectional view of a pedestal heater wafer support plate, including both a heater element and a cooling fluid tube embedded therein along with provisions for a thermocouple passage.
Figure 23:
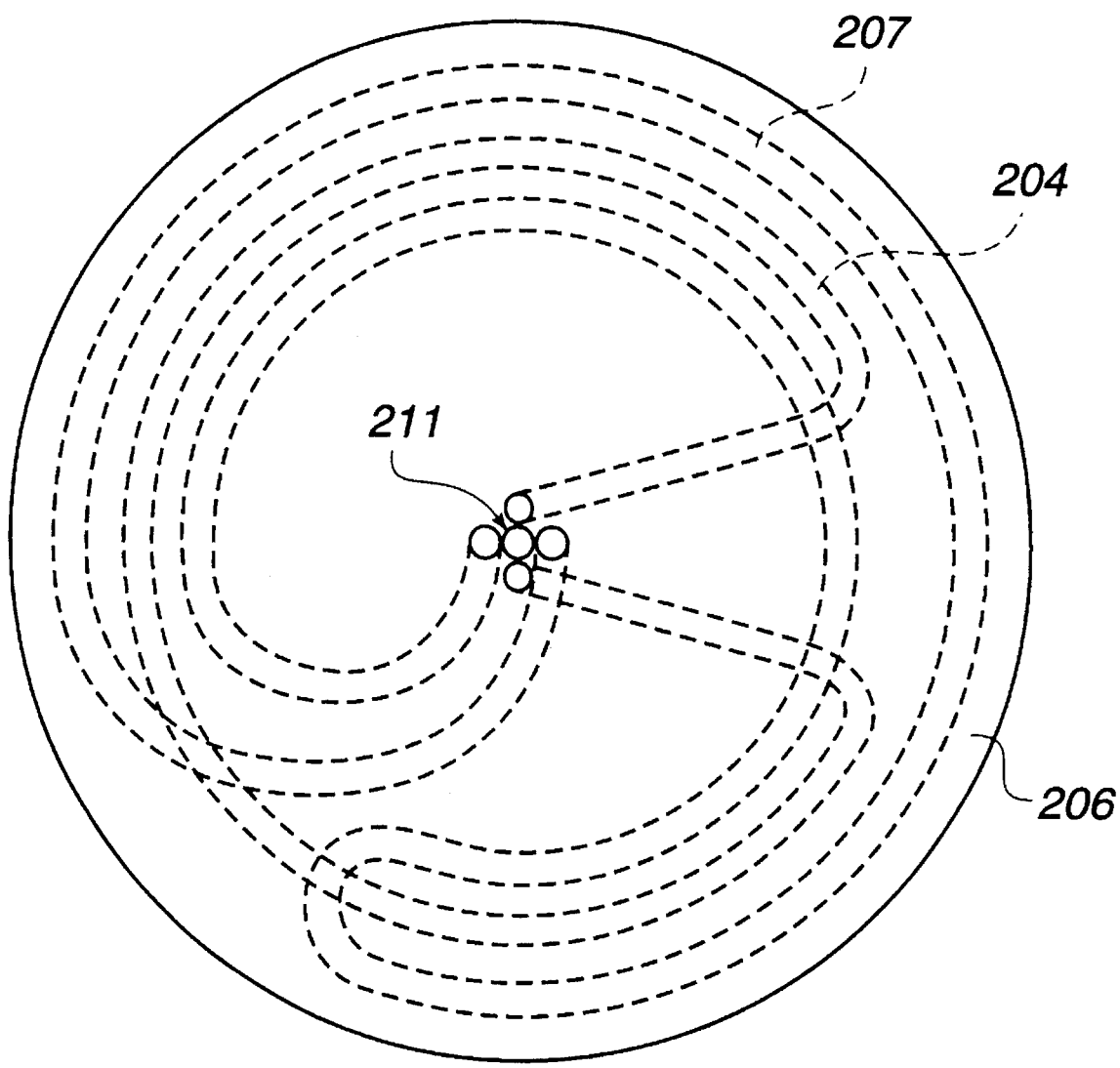
FIG. 23 shows a bottom view showing the routing and orientation of the various heating, cooling and thermocouple members of FIG. 22.

FIGS. 22 and 23 show an alternative configuration of a pedestal 206 which includes a cooling duct 204 below a resistive heating coil 207 having wiring connections 213 (similar to 183 just described) as well as a centrally mounted, tubular thermocouple 211.

It is desirable to have the capability to cool the wafer support platen 206 to accelerate its cooling when maintenance access to the processing chamber and its components is desired. Time is wasted when cooling must be done slowly because there is no provision for forced cooling of the support plate to assist in accelerating its temperature drop other than venting the process chamber with cool gases, which is inefficient.

Connection lugs 209 as shown in FIG. 22 hold the pre-formed cooling, heating, and thermocouple tube assembly during casting of the support pedestal 206. The lugs may be removed after the support pedestal 206 has been cast, or may be left in place if they fit inside the hollow opening of the pedestal stem. A hollow stem similar to the one previously described is provided for in this configuration although it is not shown. A bottom plan view of the cooling coil 204 is shown in FIG. 23. As can be seen the cooling coil is a single loop with its perimeter running along the path of a circle concentric to the path of the heater coil 207. The diameter of the cooling coil concentric path as shown is greater than the diameter of the inner portion of the heating coil and less than the diameter of the outer portion of the heating coil, however other diameters may also be used. Its diameter is 4. in. (203.2 mm) and it is located 1.87 in. (47.5 mm) from the top of the wafer support pedestal 206. The cooling coil is configured in an attempt to provide nearly equal cooling across the full area of the wafer support plate.

Cooling fluids used in the cooling tube include the typical fluid types i.e. a water based ethylene glycol or oil based thermal transfer fluids. When choosing a cooling liquid, consider the operating temperature of the wafer support platen 206, and whether it is important to keep the cooling tube filled with cooling liquid. The cooling tube is located below the heater coil as can be seen in FIG. 22.

7. Corrosion Resistant Shield Over Pedestal

Plasma etch chambers commonly include a corrosion-resistant, dielectric shield over the metal wafer support pedestal to protect the pedestal from corrosion by etchant gases. Corrosion-resistant shields are not generally used in deposition chambers because the deposition process gases generally are not corrosive, but the wafer support pedestal (and other chamber components) does suffer corrosion during the cleaning processes that must be performed periodically in a deposition chamber. Our plasma-enhanced deposition chamber beneficially includes a shield to protect the pedestal from corrosion during such cleaning processes, thereby extending the life of the pedestal.

Our shield seals the pedestal from the reactant gases so well that the pedestal needs no anodization or other corrosion-resistant coating. The pure aluminum surface of the pedestal can be polished to a higher smoothness than anodized surfaces, thereby permitting better and more uniform thermal and electrical coupling between the pedestal and the semiconductor wafer supported thereon. Better temperature and electrical uniformity results in better uniformity of the film deposited on the wafer.

Materials suitable for protecting the pedestal from corrosion generally have different thermal expansion coefficients than the aluminum pedestal. Our shield includes alignment devices which allow the shield and the pedestal to expand and contract at different rates while preserving the rotational alignment of the semiconductor substrate supported thereon.

FIGS. 11, 12, and 13 show close-up features of a cross-sectional view of the wafer support pedestal 136 (heating and cooling members are not shown). FIGS. 15, 16, 17, 18, and 19 depict various general aspects of the construction of the pedestal 136. The pedestal 136 is a cast piece of high purity aluminum into which have been formed four counterbored through holes 164 (FIGS. 11 and 12) which are configured to receive descending hollow stud wafer lift pin guides which receive wafer lift pins 162 having an enlarged upper end (see FIGS. 12, 13). A typical ceramic lift pin 162 as shown in FIG. 13 fits into and is supported by the wafer lift pin hole 164. The lift pins 162 are made of a ceramic material, such as aluminum oxide, and have a double truncated cone shaped head as seen in FIG. 13. The bottom end of the pin is rounded. The pin 162 has a diameter of 0.139 inch (3.53 mm), and the hollow stud guide has an inside diameter of 0.157 inch (3.99 mm).

Figure 14:
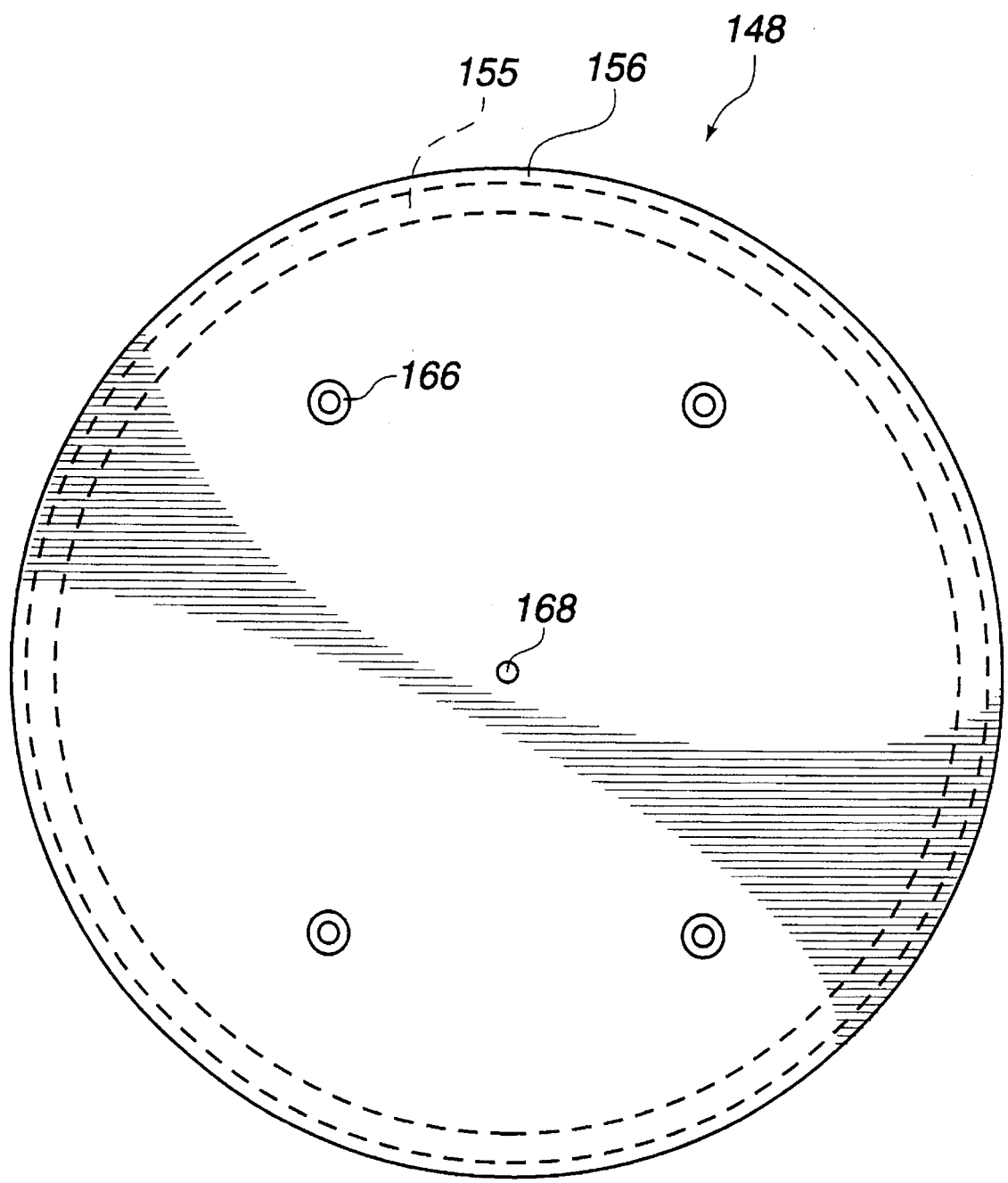
FIG. 14 shows a bottom view of an aluminum nitride cover plate liner according to the invention.

The cover plate or shield 148 which covers the aluminum pedestal 136 is a ceramic (preferably aluminum nitride) disc having at its center a downwardly extending hollow stud (guide features) 166 located to angularly align to the four locations of the holes 164 in the pedestal 136 (see FIGS. 14, 15). The disc-shaped aluminum nitride shield 148 is placed on top of the wafer support pedestal 136 and includes at its center a downward protrusion or lug 168 which fits with a tight clearance, approximately 0.015 inches (0.38 mm), in a lug receiving hole 171 at the center of the top of the pedestal 136. The four lift pin holes 164 (see FIG. 15) are not uniformly distributed about the pedestal, but form a rectangle having at least one side that is wider than the width of a robot blade a thin, flat bar (not shown), around which the lift pins 162 must lift the wafer. The aluminum nitride cover plate 148 includes a top central surface 154 (approx. 0.040" or 1.02 mm thick) on which the wafer (not shown) is supported. The wafer support surface 154 is surrounded by an annular raised perimeter flange 155 so that the wafer is accurately located during processing.

The difference in rates of thermal expansion between the aluminum pedestal or platen 136 (high thermal expansion rate) and the ceramic cover or shield 148 (low expansion rate) requires that movement be allowed between these two pieces. Past designs suffered relative movement between the dielectric cover and the pedestal in unpredictable directions in response to temperature changes. In our shield (FIG. 14) and pedestal (FIGS. 15–16), an annular center pin 168 protruding below the center of the shield mates snugly with a center hole 171 aligned with a central axis 169 on the pedestal to precisely center the shield on the pedestal, and the downwardly extending hollow stud 166 protruding below the shield mates with an elongated hole 172 in the pedestal to constrain the shield from rotational, motion, while permitting radial motion between the shield and the pedestal in response to temperature changes.

As seen in FIGS. 15 and 18, the long axis 176 of the elongated hole 172 is oriented along a radius of the pedestal. The long axis is long enough to accommodate the maximum expected differential thermal expansion between the shield and the pedestal. The short axis 174 is oriented perpendicular to the radius (i.e., oriented in a tangential, azimuthal, or circumferential direction), and it is just wide enough to accept the downwardly extending hollow alignment stud (alignment pin) 166.

In our preferred embodiment, the elongated hole 172 is a counterbore at the upper end of one of the four bores 164 enclosing a lift pin 162 (see FIG. 11, 12), and the downwardly extending hollow stud 166 functions as a guide sleeve for the lift pin. However, the elongated hole 172 could be at any location on the pedestal away from the center, rather than being coincident with a lift pin bore, in which case the downwardly extending hollow stud 166 would not function as a lift pin guide sleeve.

Each of the other three lift pin bores 164 in the pedestal 136 has a counterbore 170 which mates with a corresponding descending hollow stud (guide to sleeve) 166 protruding below the shield 148. Each of these three counterbores 170 provides a large clearance around the downwardly extending hollow stud (mating guide sleeve) 166 so that they will not interfere in case of differential thermal expansion of the shield and pedestal. In our preferred embodiment, the diameter of each of these three counterbores 170 equals the length of the long axis 176 of the elongated hole 172.

Aluminum nitride ceramic is the preferred material for the cover shield 148 because it has high thermal conductivity, excellent corrosion resistance, and excellent tolerance of thermal shock. However, aluminum nitride is very expensive to fabricate, and it is not easy to fabricate a single piece which will cover both the top and sides of the pedestal or platen 136 as needed to protect it from corrosive process gases. High thermal conductivity is not needed in the material shielding those portions of the pedestal which do not directly underlie the semiconductor wafer, that is, the cylindrical side of the pedestal and the periphery of the top face of the pedestal. Therefore, these portions of the pedestal are protected by an aluminum oxide outer shield ring 150 having an "L"-shaped cross section. The inner, horizontal portion 152 of the outer shield ring 150 overlaps the peripheral portion 156 of the aluminum nitride cover shield 148 outside the raised perimeter flange 155. The outer shield ring 150 also has a depending skirt 158 which extends partly down the cylindrical side of the pedestal 136. The clearance between the skirt 158 and the circumference of the pedestal 160 is great enough to accommodate differential thermal expansion, but small enough to substantially shield the pedestal from contact with corrosive process gases.

The outer ring 150 rests on the periphery of the top face of the pedestal, outside the circumference of the cover shield 148. A vertical gap between the inner horizontal portion 152 and the peripheral portion 156 of the cover shield 148 prevents vertical interference and lifting of the pieces unintentionally. The central region of the cover shield 148 typically has a thickness of 0.020 inch (0.5 mm) to 0.080 inch (2 mm), or specifically 0.04 inch (1 mm) in the illustrated implementation. The raised peripheral portion 156 typically has a thickness of 0.03 inch (0.8 mm) to 0.1 inch (2.5 mm), or specifically 0.040 in (1 mm) in the illustrated implementation.

8. Dielectric Lining on Chamber Wall

As described above, our wafer support pedestal or platen 136 is covered by a corrosion-resistant shield 148 to protect the pedestal from corrosion by process gases, particularly during the plasma etch process used for cleaning the chamber between deposition processes. As also described above, during both etching and deposition the plasma is excited by applying an RF voltage between the wafer support pedestal and the gas distribution plate 122. The cover shield 148 generally is a dielectric, so it increases the electrical impedance between the plasma and the pedestal. If the aluminum chamber side wall 265 (FIG. 1) were exposed to the plasma, it would present a lower impedance path for current from the plasma, and therefore would undesirably deflect away from the semiconductor wafer the plasma containing the deposition process reagents, thereby lowering the rate of deposition on the wafer and undesirably depositing material on the chamber walls.

This problem can be overcome by covering the interior surface of the cylindrical chamber wall with a dielectric lining which imposes an electrical impedance between the chamber wall and the plasma body which is substantially greater than the electrical impedance between the pedestal and the plasma body. A high electrical impedance can be achieved by making the dielectric liner on the wall much thicker than the shield disc on the pedestal, and, optionally, by also choosing for the wall liner a material having a lower dielectric constant than the material of the shield disc.

In our deposition chamber, the inside of the chamber wall is covered by upper and lower annular dielectric liners 234 and 236 (although a single liner could be 8 used). (See FIGS. 1 and 2.) The upper liner rests on the lower liner, which rests on a shelf 251 on the chamber wall. Additionally, the inside surface of the chamber lid 221 is covered by the insulator 120 which was described above in regard to its function of insulating the gas distribution plate 122 from the chamber lid.

In our implementation, the upper and lower wall liners 234 and 236 each are composed of alumina about one inch (25 mm) thick, and the lid insulator 120 is about one inch thick. In contrast, the cover shield 148 is only about 0.040 inch (1 mm) thick. In addition, as described above, the cover shield 148 is of very uniform thickness, and the pedestal top face is very smooth unanodized aluminum, so as to provide the lowest possible, and most spatially uniform, impedance between the pedestal and the wafer supported thereon. Therefore, the impedance between the pedestal and the plasma body is much less than the impedance between the chamber wall and the plasma body. This promotes efficiency and uniformity of deposition on the semiconductor wafer. (To minimize nonuniformity between the edge and center of the wafer, the gas distribution plate also is larger than the wafer diameter, preferably by about twenty percent.)

9. Top Assembly

Figure 6:
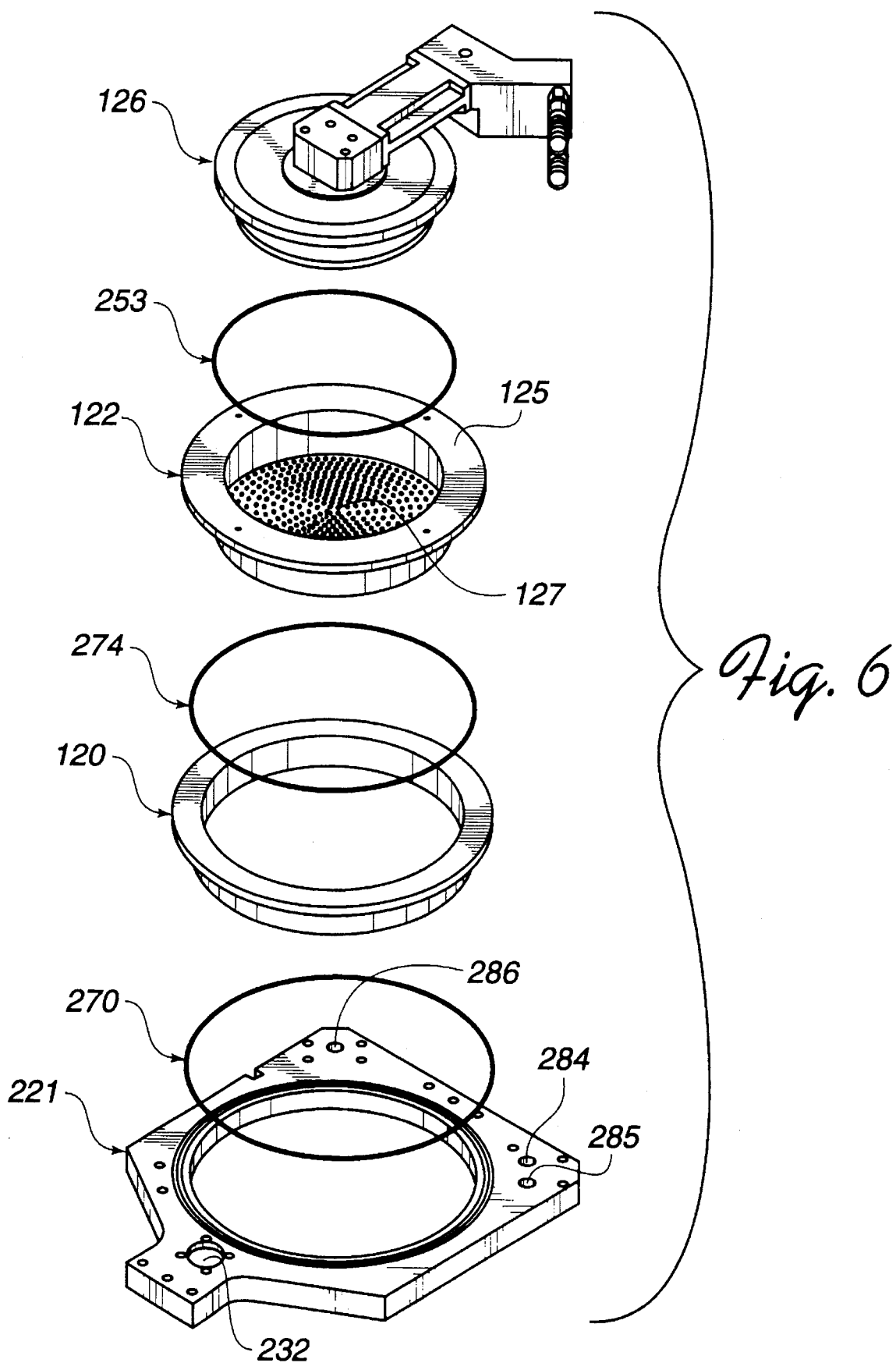
FIG. 6 is an exploded view of the lid and its components as consist to supply gas to the processing chamber through the lid of the processing chamber.

As shown in FIG. 1, the gas distribution faceplate 122 preferably made of aluminum is electrically insulated from the surrounding chamber lid 221 by an annular insulator or isolator 120, preferably made of alumina. The circular gas distribution faceplate 122 is supported by a surrounding flange 125, shown in FIG. 6. The flange 125 rests on and is sealed to the top of the insulator 120 by an O-ring seal 274 as seen in FIGS. 1, 2, and 6. The bottom 127 of the faceplate 122 includes gas distribution holes 121 (FIG. 1) through which the process gas is directed toward a substrate being processed. The gas inlet manifold 126 includes a slightly overlapping flange which with O-ring 253 seals the manifold 126 to the top of the faceplate flange 125. The bottom 127 of the faceplate 122 is exposed to the process chamber conditions on a vacuum (process chamber) side of the faceplate inner and outer seals, while the top of the flange 125 of the faceplate 122 is exposed to atmosphere.

The configuration of the processing chamber as described above provides layered and nested pieces which are joined only by surfaces having O-ring seals thereby eliminating all threaded connections within the processing chamber and thereby reducing the likelihood of contamination of the processing chamber due to threaded connections which when tightened can flake off particles which could contaminate the semiconductor substrate being processed in the chamber. This thread free configuration also minimizes the chamber recovery time and number of wafers that need to be run to stabilize the chamber to reach stable operating conditions and eliminate or settle airborne particles after chamber re-assembly.

The RF power supply connection through a connector 298 (FIG. 4) to the faceplate 122 is made on the non-vacuum side of the inner 274 and outer 253 seals (O-rings) of the faceplate 122. In particular the connection is made to the top of the faceplate flange 125. Because the RF connector 298 is outside the vacuum enclosure of the process chamber, any particles produced by rubbing or arcing within the RF connector cannot enter the chamber, and hence cannot contaminate the semiconductor substrates being processed.

FIGS. 1, 2, and 6 show the lid insulator 120 being fitted into the center aperture of the chamber lid 221 with an O-ring 270 sealing between the two surfaces. The gas distribution faceplate 122 is located within the isolator 120 and sealed to it by an O-ring 274. The gas distribution faceplate 122 has several holes on its perimeter flange, any one of which may be used to connect to the RF power supply.

FIG. 1 shows the assembly of the blocker plate 124 as part of the inlet manifold 126. The blocker plate 124 is attached to the inlet manifold using threaded fasteners. The blocker plate provides several holes around and across its surface to initially diffuse the gas flowing through the gas distribution manifold 126 toward the bottom (back side) of the gas distribution faceplate 122. An O-ring 253 seals the inlet manifold 126 against the top of the flange 125 of the faceplate 122 as shown in FIGS. 1, 2, and 6.

FIG. 5 shows an insulated inlet gas manifold 296 connecting the inlet openings through gas passages on the lid 221 to the inlet gas passages 284, 285 (FIG. 6) on the inlet manifold 126. The insulated inlet gas manifold 296 includes bolted metallic connections at either of its ends with a central connection or span of a non-conductive temperature resistant material such as alumina. In this configuration gas is passed from the processing chamber body, through the lid 221, into the inlet gas manifold 296, and then into the faceplate inlet manifold 126. The insulated inlet gas manifold 296 prevents the energized gas distribution faceplate 122 from being grounded to the lid 221. An insulated bar (beam) clamp secures the gas inlet manifold to the lid 221.

Clamp towers (not shown) are positioned at diagonal corners of the lid 221. An isolation cover piece (not shown) made of a non-conductive material (such as Teflon) is positioned over the insulator inlet gas manifold 296. A clamp presses and clamps all of the pieces of the gas inlet assembly together and to the lid 221.

FIG. 1 and 2 shows a window material 230 (preferably made of single crystal sapphire, as it is non-reactive with fluorine) secured and sealed in position by an O-ring in the lid 221 over the view port opening 232 of the lid 221 by a UV filter 233.

FIG. 4 shows a view of the RF connection through the lid 221 to one of the perimeter holes of the gas distribution faceplate 122 and a similar hole in the inlet manifold 126. The RF supply passage 286 in the lid 221 is fitted with an insulating through member 263 surrounding a floating spring loaded RF supply connection pin 294 in a recessed opening. A conductive strap 298 is connected to the RF supply connection pin 294 through the lid 221 and is also connected by a threaded connection to the gas distribution faceplate 122 and inlet manifold 126. An insulating top cover 264 covers the recessed opening of the insulated member 263. The location of the RF passage 286 in the 221 is shown on the far side of the lid 221 pictured in FIG. 6.

Figure 7:
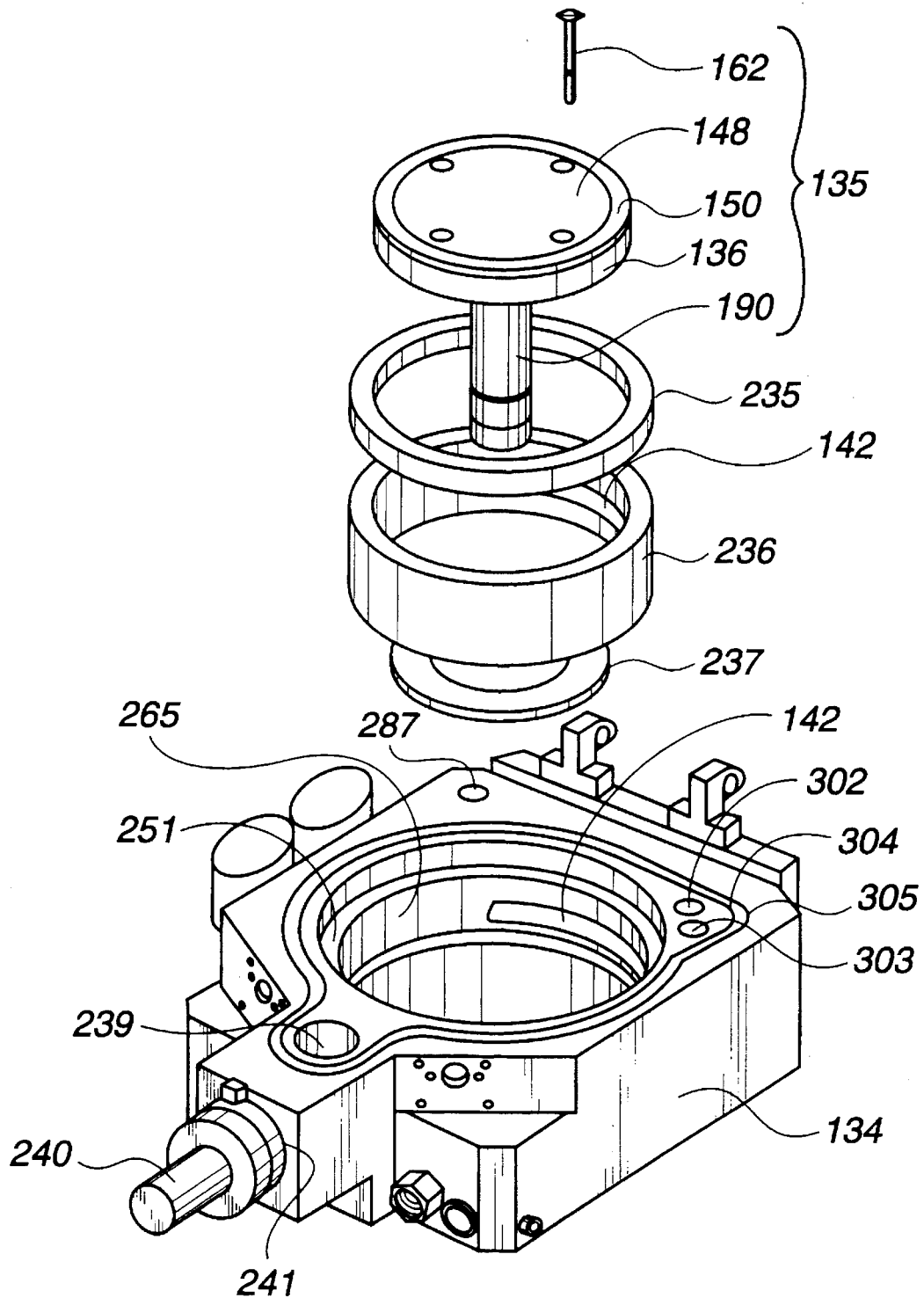
FIG. 7 is and exploded view of the lower processing chamber as would be assembled to make a configuration according to the invention.

FIG. 7 shows the chamber body 134 and its features. The body 134 has an RF supply conductor passage 287 (which is aligned with the conductor supply passage 286 in the lid 221) in its left rear corner outside an O-ring groove 304 and an RF gasket groove 305. Inside the grooves a pair of gas supply passages 302, 303 supply gas to the lid passages 284, 285 (FIG. 6). The wall 265 of the chamber body 134 and the lower ring liner 236 includes the insertion/removal opening 142 as previously discussed for FIG. 1. The configuration of the body 134 includes the vacuum gas passage 239 and a vacuum shut-off valve 240 (FIG. 1) located in the vacuum shut-off valve receiving hole 241 and sealing against the seal surfaces 246 as earlier discussed and pictured in FIGS. 1, 2.

FIG. 7 further shows an exploded view of the assembly of the internal pieces of the chamber body 134. The A pin lift collar 237 fits under the pedestal assembly 135. The lower side wall liner 236 and upper side wall liner 234 forming a ceramic wall liner are supported by a shelf 25 1 on the inner wall 265 of the process chamber lower body 134. The already assembled pedestal assembly 135 (support plate 136, stem 190, and cover plates (e.g., 148, 150)) is put in position. Lastly, the lift pins 162 are dropped into place.

10. Adjustable Pedestal Tilt

As discussed above a semiconductor wafer is inserted into and removed from a chamber lower body 134 through an insertion/removal opening 142. During insertion and removal, as shown in FIGS. 1, 3, and 8, the pedestal wafer support platen 136 is positioned (by a pedestal raising and lowering mechanism) below the insertion/removal opening 142 so that a robot arm (not shown) can move into the chamber, a wafer can be lifted off the robot arm by lift pins 162 which are raised by the lift pin collar 237 supported by a lift pin collar support tube 243.

A series of four wafer lift pins 162 are provided in wafer lift pin guide studs through the aluminum nitride coating 148 covering the central surface of the pedestal heater 136. The wafer lift pins 162 are raised and lowered from their guide studs in the cover plate by a wafer lift pin collar 237 which contacts the bottom of the lift pins 162. The lift collar 237 is supported and moved up and down by the wafer lift pin collar support tube 243 which rises and descends to raise and lower the lift pins from the surface of the pedestal heater.

The wafer lift pin collar support tube 243 surrounds the pedestal stem 190 and assists in insulating bellows 267, 268 attached between the end of the stem 190 and the bottom of the processing chamber from thermal energy radiating from the stem 190, the pedestal platen 136, and the inside of the processing chamber.

Figure 8:
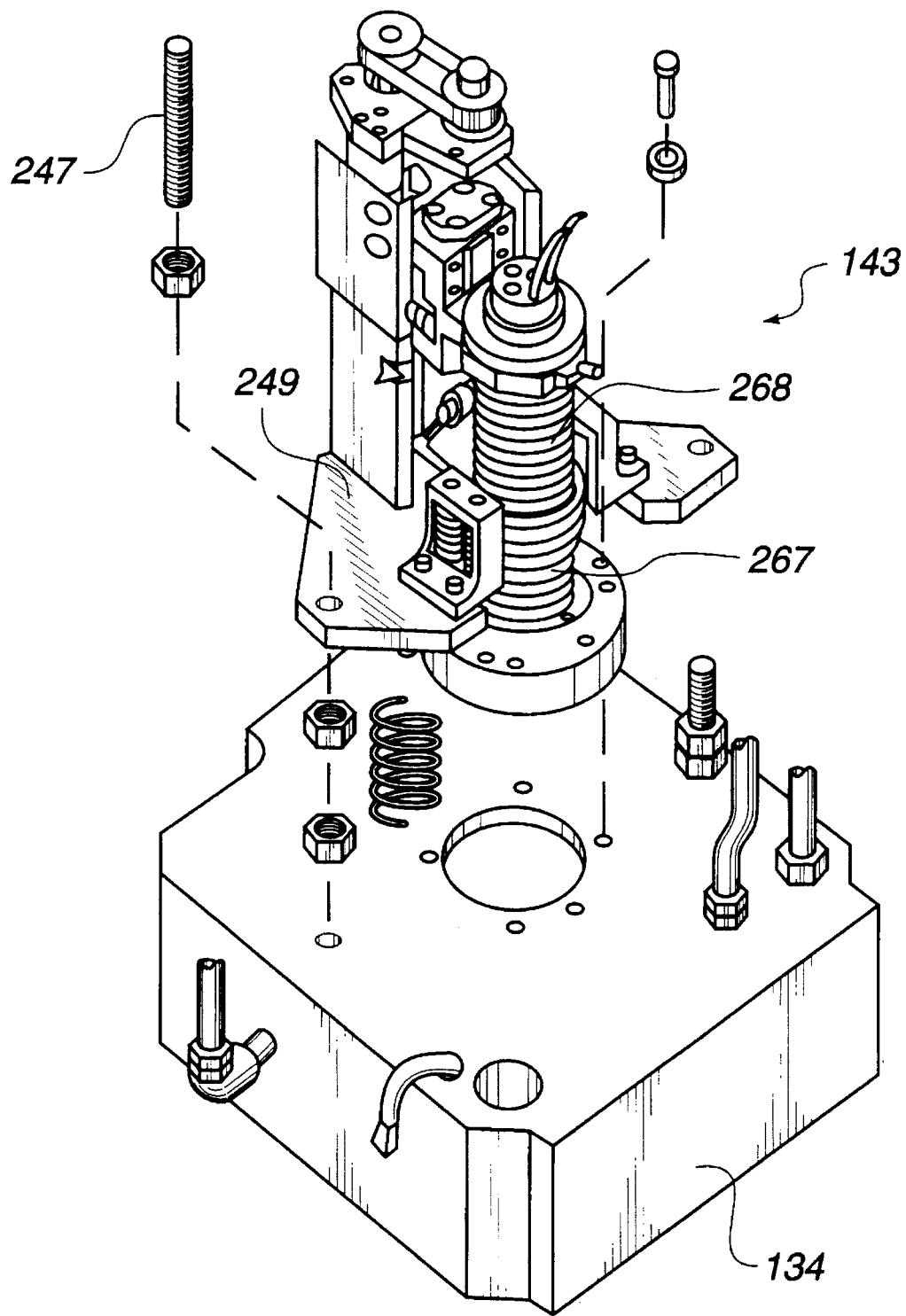
FIG. 8 shows the bottom view of a processing chamber according to the invention and as shown in FIG. 7.
Figure 9:
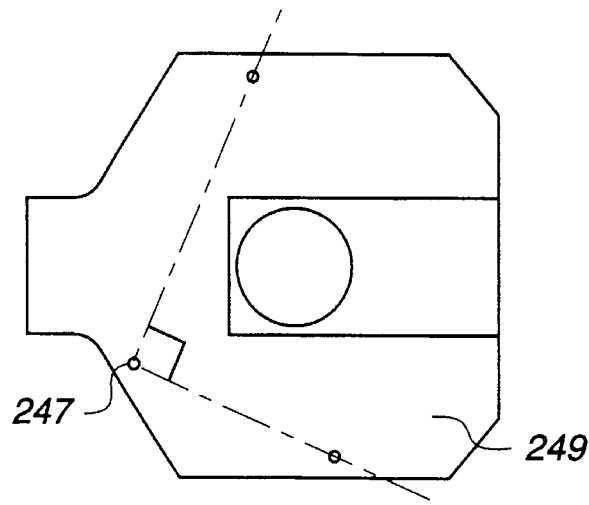
FIG. 9 shows the schematic diagram of the hole pattern of adjustment screws as used to adjust the attitude of pedestal according to the invention.

FIG. 8 shows the process chamber lower body 134 turned over and the pedestal lift mechanism 143 in position to be attached to the body 134. A series of bellows 267,268 allow for free movement of the pedestal up and down and also allow for some angular movement. Because the thickness of a deposited layer in a PECVD process is sensitive to distance between the gas distribution faceplate and the surface of the wafer being processed, it is important to have adjustments to maintain parallelism between these two surfaces. A yoke plate 249 (FIGS. 3, 8, 9) supports the pedestal support and lift drive mechanism 143 on a series of three adjustment screws or members 247, only one of which is shown in FIG. 8. The yoke plate 249 includes three wide spaced holes in a triangular pattern which allow for leveling of the top of the pedestal by adjusting one or more of the three adjustment screws or members 247 in situ. The arrangement of the three adjustment screws should form a fight angle for ease of adjustment as shown in FIG. 9.

During operation the process chamber process gas and RF supply are permanently fixed and supplied to the bottom side of the processing chamber. The feed through gas and RF connection passages in the bottom of the processing chamber assembly 133 connect to the lid 221 of the processing chamber. When the lid of the processing chamber is hinged open the gas passage to the gas distribution faceplate and the RF connection to the gas distribution faceplate is broken. Interlock sensors may automatically shut off the gas flow and the RF power supply when the process chamber lid is raised. Under normal conditions when a vacuum exists in the process chamber the force of atmospheric pressure on the outside of the lid will prevent the lid from being raised.

While the invention has been described with regards to specific embodiments, those skilled in the art will recognize that changes can be made in form and detail without departing from the spirit and scope of the invention.

We claim:

1. An apparatus comprising:

a vacuum processing chamber for processing a substrate at a substrate processing location therein;

a substrate support for supporting the substrate at said substrate processing location; and a gas distribution faceplate opposite said substrate support for directing process gas toward said substrate processing location, wherein said chamber includes a body portion surrounding a perimeter of said substrate support and said substrate processing location, said body portion including a top surface against which a lid of said chamber is sealed, said lid when in position on said top surface faces: a top of said substrate support, said substrate processing location, a top of a perimeter wall of said substrate processing location, and a bottom portion of a vacuum duct disposed between said lid and said body portion surrounding said top of the perimeter wall of said substrate processing location, inside seal limits of the chamber gas seal between the body portion and the lid, said vacuum duct being connected to a vacuum system evacuating the processing chamber;

wherein said lid includes a gas supply opening located opposite said substrate processing location;

wherein said gas distribution faceplate is located within said gas supply opening in said lid and is separated from said lid by an annular insulating ring, said annular insulating ring is configured in the shape of a hollow tube with an insulating ring outside flange at one end, wherein an outside of said tube matches the shape of the inside of said gas supply opening in said lid and said tube is sized to pass through said gas supply opening into the chamber, wherein said insulating ring outside flange is configured to overlap a top surface of said lid adjacent to an edge of said gas supply opening, Said insulating ring being sealed to said lid gas supply opening, wherein said gas distribution faceplate is configured to be supported within said gas supply opening by said annular insulating ring to which it is sealed, wherein in use a bottom end of said annular insulating ring is configured to be disposed opposite said top of the perimeter wall of said substrate processing location forming one or more openings between the bottom end of the annular insulating ring and the top of the perimeter wall of said substrate processing location, said one or more openings act as one or more orifice gas passages between the substrate processing location and vacuum duct of said chamber.

2. An apparatus as in claim 1, wherein said one or more openings between the bottom end of the annular insulating ring and the top of said ring of lining material are configured to be approximately equidistant from a center of the substrate located at said substrate processing location.

3. An apparatus as in claim 2, wherein said one or more openings between the bottom end of the annular insulating ring and the top of said ring of lining material is a 360 degree slot.

4. An apparatus comprising:

a vacuum processing chamber for processing a substrate;

a substrate support for supporting the substrate at a substrate processing location in said vacuum processing chamber a gas inlet for supplying process gas to said processing chamber for processing said substrate;

wherein said processing chamber includes one or more openings in an inner chamber surface which communicate with a vacuum duct in a wall of said chamber, said vacuum duct being connected to a vacuum system, wherein gas passing from said duct to said vacuum system passes through a vacuum duct lateral extension portion of said processing chamber, wherein a surface of said lateral extension portion includes a view window port through a wall of said chamber, said view window port being sealed so that the inside of a lateral extension portion of the vacuum passage can be viewed by looking through a window acting as part of the seal for said view window port.

5. An apparatus as in claim 4, wherein said window acting as part of the seal through which viewing can take place is sapphire.

6. An apparatus as in claim 4, wherein said processing chamber includes a lid portion and a body portion, wherein said vacuum duct is disposed between said lid portion and said body portion.

7. An apparatus as in claim 6, wherein said lateral extension is disposed between said lid portion and said body portion.

8. An apparatus as in claim 7, wherein said view window port is in said lid portion.

9. An apparatus as in claim 7, wherein said lateral extension portion of said bottom of said lid includes a view window port through said lid, said view window port on a top of said lid being sealed so that the inside of a lateral extension portion of the vacuum passage can be viewed by looking through a window acting as part of the seal for said view window port.

10. An apparatus comprising:

a substrate support plate disposed in a substrate processing chamber, a ceramic cover liner plate supported on and substantially covering a central portion of a top surface of said wafer support plate, said cover liner plate includes a central hub which fits into a corresponding central hub receiving hole in a top surface of said wafer support plate, said cover liner plate includes wafer lift pin support features therein at locations corresponding to lift pin holes in said wafer support plate, at least one of said features including a descending hub which fits into an elongated hole in said top side of said plate having a width dimension perpendicular to a radial line from said central hub receiving hole to said elongated hole generally similar to the diametrical dimension of the hub in the same direction, while said elongated hole has a length dimension along the direction of the aforementioned radial line substantially larger than a diametral dimension of said wafer lift support feature along said radial line such that the range of differential movement between the cover liner plate and the wafer support plate when said central hub is positioned in said central hub receiving hole due to differential thermal expansion between the cover liner plate and the wafer support plate when the cover liner plate and wafer support plate are exposed to the temperature conditions of a substrate processing environment accommodates the motion between the cover liner plate and wafer support plate without interference.

11. An apparatus as in claim 10, wherein each feature having a descending hub other than said at least one descending hub configured to fit in said elongated hole are received into wafer pin holes which are configured to receive each descending hub other than said at least one descending hub without any contact between a side of each descending hub other than said at least one descending hub and edges of the wafer lift pin holes.

12. An apparatus as in claim 10, further comprising:

an edge ring made of a ceramic material generally having an "L" shaped section such that a first leg of said "L" shaped section forms a peripheral ring which overlaps the outer edge of the cover liner plate and a second leg of said "L" shaped section forms a skirt around the outside surface of said wafer support plate.

13. An apparatus as in claim 12, wherein said ceramic cover liner plate includes a raised ring encircling a substrate receiving surface in the central area of the top of the cover liner plate, wherein said cover liner plate further includes a perimeter area outside of said raised ring, wherein said first leg of said "L" shaped section overlaps said perimeter area outside of said raised ring.

14. An apparatus as in claim 13, wherein said first leg of said "L" shaped section does not overlap said raised ring.

15. An apparatus as in claim 13, wherein said cover liner plate is aluminum nitride and said edge ring is aluminum oxide.

16. An apparatus as in claim 10, wherein said ceramic cover liner plate includes a raised ring encircling a substrate receiving surface in the central area of the top of the cover liner plate.

17. An apparatus as in claim 10, wherein said apparatus supports a substrate at a substrate processing location in a vacuum processing chamber opposite a gas distribution faceplate, wherein said chamber includes an inner chamber surface adjacent to and surrounding said substram processing location, wherein one or more openings in said inner chamber surface communicate with a vacuum duct encircling said substrate processing location, said vacuum duct being connected to a vacuum system, wherein said one or more openings in said chamber are configured to provide a generally uniform distribution of gas flow over the substrate at the substrate processing location as a process gas flows from a set of holes in said gas distribution faceplate to said one or more opening in said chamber.

18. An apparatus comprising:

a wafer support plate composed of a thermally conductive material having a heater element embedded therein with wiring from said heater element extending from a back side of said wafer support plate, said wafer support plate including a temperature sensor receiving hole open to said back side of said wafer support plate, wherein said heater element embedded in the thermally conductive material includes a single continuous heater loop, the heater loop being configured so that said heater element is routed to run from a joint with a first heater connection wire generally along a first diameter of said support plate, heater element looping at its end to run generally along a second diameter of said support plate to terminate at a joint with a second heater connection wire such that the elements along said first and said second diameters run generally parallel to one another generally following the lines of concentric circles generally centered in said wafer support plate, the path of the heater element does not cross itself.

19. An apparatus as in claim 18, wherein the first and second heater connection wires from said heater element connect to said heater element within said wafer support plate at a location displaced from the location where said wiring emerges from said backside of said wafer support plate.

20. An apparatus as in claim 19, further comprising:

a stem having one or more openings therethrough to provide passage for said heater wiring and a temperature sensor extending into said temperature sensor receiving hole, said stem being gas tightly sealed and fixed to said back side of said wafer support plate to contain the locations where said heater wiring extends from and said temperature sensor receiving hole is open to the back side of said wafer support plate, so that the apparatus can be fixed to and supported only by an apparatus support member attached to a bottom portion of said stem and a central core of said stem including said one or more openings can be exposed to atmospheric conditions while a substantial portion of an outside surface of said stem is exposed to vacuum conditions in a vacuum processing chamber when said stem is sealingly mounted in a vacuum processing chamber.

21. An apparatus as in claim 20, further comprising:

an ceramic cover liner plate supported on and substantially covering a central portion of a top surface of said wafer support plate, said cover liner plate includes a central hub which fits into a corresponding central hub receiving hole in a top surface of said wafer support plate, said cover liner plate includes wafer lift pin support features therein at locations corresponding to lift pin holes in said wafer support plate, each feature of said features including a descending hub protruding from a back side of said cover liner plate, at least one of the descending hubs fits into an elongated hole in said top side of said plate having a width dimension perpendicular to a radial line from, said central hub receiving hole to said elongated hole generally similar to the diametral dimension of the hub in the same direction, while said elongated hole has a length dimension along the direction of the aforementioned radial line substantially larger than a diametral dimension of said wafer lift support feature along said radial line such that the range of differential movement between the cover liner plate and the wafer support plate when said central hub is positioned in said central hub receiving hole due to differential thermal expansion between the cover liner plate and the wafer support plate when the cover liner plate and wafer support plate are exposed to the temperature conditions of a substrate processing environment accommodates the motion between the cover liner plate and wafer support plate without interference.

22. An apparatus as in claim 18, wherein a cooling tube is also embedded in said wafer support plate, said cooling tube includes tube ends which extend from a back side of said plate at a location adjacent to the location where said wiring from said heater element emerges from said wafer support plate.

23. An apparatus as in claim 22, wherein said cooling tube is configured to run along a circle concentric to the concentric circular paths followed by the inner portion and the outer portion of the heater element, the concentric circle along which said cooling tube runs having a diameter less than the diameter of the concentric circle followed by said outer portion of said heater element and having a diameter greater than the diameter of the concentric circle followed by said inner portion of said heater element.

24. An apparatus as in claim 23, wherein said cooling tube is embedded in said wafer support plate on a plane a greater distance from a surface of said wafer support plate than said heater element.

25. An apparatus as in claim 22, further comprising:

a stem having one or more openings therethrough to provide passage for said heater wiring and a temperature sensor extending into said temperature sensor receiving hole, said stem being gas tightly sealed and fixed to said back side of said wafer support plate to contain the locations where said heater wiring extends from and said temperature sensor receiving hole is open to the back side of said wafer support plate, so that the apparatus can be fixed to and supported only by an apparatus support member attached to a bottom portion of said stem and a central core of said stem including said one or more openings can be exposed to atmospheric conditions while a substantial portion of an outside surface of said stem is exposed to vacuum conditions in a vacuum processing chamber when said stem is sealingly mounted in a vacuum processing chamber.

26. An apparatus as in claim 25, further comprising:

an ceramic cover liner plate supported on and substantially covering a central portion of a top surface of said wafer support plate, said cover liner plate includes a central hub which fits into a corresponding central hub receiving hole in a top surface of said wafer support plate, said cover liner plate includes wafer lift pin support features therein at locations corresponding to lift pin holes in said wafer support plate, each feature of said features including a descending hub protruding from a back side of said cover liner plate, at least one of the descending hubs fits into an elongated hole in said top side of said plate having a width dimension perpendicular to a radial line from, said central hub receiving hole to said elongated hole generally similar to the diametral dimension of the hub in the same direction, while said elongated hole has a length dimension along the direction of the aforementioned radial line substantially larger than a diametral dimension of said wafer lift support feature along said radial line such that the range of differential movement between the cover liner plate and the wafer support plate when said central hub is positioned in said central hub receiving hole due to differential thermal expansion between the cover liner plate and the wafer support plate when the cover liner plate and wafer support plate are exposed to the temperature conditions of a substrate processing environment accommodates the motion between the cover liner plate and wafer support plate without interference.

27. An apparatus comprising:

a vacuum processing chamber for processing a substrate;

a substrate support for supporting the substrate at a substrate processing location in said vacuum processing chamber a gas inlet for supplying process gas to said processing chamber for processing said substrate;

wherein said chamber includes a body portion surrounding a perimeter of said substrate support and said substrate processing location lined with a ring of lining material resistant to the environment of the process chamber at the substrate processing location, said body portion including a top surface against which a lid of said chamber is sealed, said lid when in position on said top surface faces: a top of said substrate support, said substrate processing location, a top of said ring of lining material, and a bottom portion of a vacuum duct disposed between said lid and said body portion surrounding said top ring of said lining material inside seal limits of the chamber gas seal between the body portion and the lid, said vacuum duct being connected to a vacuum system evacuating the processing chamber;

wherein said lid includes a gas supply opening located opposite said substrate processing location;

wherein a gas distribution faceplate is located within said gas supply opening in said lid and is separated from said lid by an annular insulating ring, said annular insulating ring is configured in the shape of a hollow tube with an insulating ring outside flange at one end, wherein an outside of said tube matches the shape of the inside of said gas supply opening in said lid and said tube is sized to pass through said gas supply opening into the chamber, wherein said insulating ring outside flange is configured to overlap and seal a lower surface of said flange against a top surface of said lid adjacent to an edge of said gas supply opening, wherein said gas distribution faceplate is configured to be supported within said gas supply opening by said annular insulating ring to which it is sealed, wherein in use a bottom end of said annular insulating ring is configured to be disposed opposite said top of said ring of lining material forming one or more openings between the bottom end of the annular insulating ring and the top of said ring of lining material, said one or more openings act as orifice gas passages between the substrate processing location and vacuum duct of said chamber.

28. An apparatus as in claim 27, wherein a 360 degree slot opening from said substrate processing location to said vacuum duct comprises said one or more openings between the bottom end of the annular insulating ring and the top of said ring of lining material.

29. An apparatus as in claim 27, wherein said ring of lining material includes one or more removable rings which are disposed internal to a wall of said processing chamber adjacent to said substrate processing location.

30. The apparatus as in claim 27, wherein said ring of lining material is a ceramic.

31. The apparatus as in claim 27, wherein said annular insulating material is a ceramic.

32. The apparatus as in claim 31, wherein said ring of lining material is a ceramic.

33. An apparatus comprising:

a vacuum processing chamber for processing a substrate;

a substrate support for supporting the substrate at a substrate processing location in said vacuum processing chamber a gas inlet for supplying process gas for processing said substrate to a surface of a substrate located at said substrate processing location;

wherein said chamber includes one or more openings in an inner surface of said chamber approximately facing said substrate processing location which communicate with a vacuum duct connected to a vacuum system, wherein said duct is configured to route gas flow to the vacuum system through a vacuum connection passage in a body of said chamber and to a vacuum valve body receiving opening in said body;

said vacuum valve receiving opening including a valve seat surface for stopping gas flowing in said vacuum connection passage from said substrate processing location to said vacuum system when a vacuum valve is located in said vacuum valve body receiving opening and said valve is positioned to seal said sealing surface.

34. A method of heating a vacuum shut-off valve which when closed at least partially isolates a substrate processing chamber from a vacuum system evacuating said processing chamber comprising the steps of:

providing passages in a body of said substrate processing chamber through which gas is evacuated from said processing chamber to a vacuum chamber;

providing a valve seat for said shut-off valve within said body;

providing a valve within and in contact with said body such that thermal energy from said body is readily transferred to said valve as if the valve were integral with said body.

35. An apparatus comprising:

a vacuum processing chamber for processing a substrate;

a substrate support for supporting the substrate at a substrate processing location in said vacuum processing chamber a gas inlet for supplying process gas to said processing chamber for processing said substrate;

wherein said chamber includes one or more openings in an inner chamber surface which communicate with a vacuum duct in a wall of said chamber, said vacuum duct being connected to a vacuum system, wherein an internal surface of said processing chamber and components within said processing chamber are configured to allow maintenance of the chamber internal components without the need to remove and replace threaded fasteners in the chamber or any chamber components which are exposed to the environment of the processing chamber during use thereby eliminating the presence of particulates generated by loosening and tightening of such threaded fasteners.

36. The apparatus as in claim 35, wherein the confines of said processing chamber which components are located within are defined by limits which begin outside the gas distribution faceplate and extend to the vacuum seal of the chamber and a seal of a vacuum system shutoff valve.

* * * * *